United States Patent
Song et al.

(10) Patent No.: US 11,195,837 B2
(45) Date of Patent: Dec. 7, 2021

(54) SEMICONDUCTOR DEVICES INCLUDING SUPPORT PATTERNS

(71) Applicant: SAMSUNG ELECTRONICS CO., LTD., Suwon-si (KR)

(72) Inventors: Jae-Hoon Song, Suwon-si (KR); Kiheum Nam, Osan-si (KR); Wonchul Lee, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 8 days.

(21) Appl. No.: 16/800,105

(22) Filed: Feb. 25, 2020

(65) Prior Publication Data

US 2020/0194437 A1    Jun. 18, 2020

Related U.S. Application Data

(63) Continuation-in-part of application No. 16/440,399, filed on Jun. 13, 2019, now Pat. No. 10,720,435.

(Continued)

(30) Foreign Application Priority Data

Dec. 2, 2016    (KR) ........................ 10-2016-0163751

(51) Int. Cl.
     *H01L 27/108*    (2006.01)
     *H01L 49/02*    (2006.01)
     (Continued)

(52) U.S. Cl.
     CPC .. *H01L 27/10844* (2013.01); *H01L 21/76802* (2013.01); *H01L 21/76838* (2013.01);
     (Continued)

(58) Field of Classification Search
     CPC .......... H01L 27/10844; H01L 27/0207; H01L 29/41; H01L 23/528
     See application file for complete search history.

(56) References Cited

U.S. PATENT DOCUMENTS 7,659,602 B2    2/2010    Tegen et al.
7,897,474 B2    3/2011    Eto
(Continued)

FOREIGN PATENT DOCUMENTS

KR    10-2009-0044553 A    5/2009
KR    10-2014-0065186 A    5/2014

OTHER PUBLICATIONS

USPTO Office action dated Feb. 26, 2020 for parent U.S. Appl. No. 16/440,399.

(Continued)

*Primary Examiner* — Mark V Prenty
(74) *Attorney, Agent, or Firm* — Lee IP Law, P.C.

(57) ABSTRACT

A semiconductor device comprises a plurality of pillars on a semiconductor substrate, and a support pattern in contact with at least one side surface of each of the pillars. The support pattern connects the pillars with one another. The support pattern includes a plurality of support holes that expose side surfaces of the pillars. The support holes includes a first support hole and a second support hole that are spaced apart from each other. The pillars have circular cross-sections. A ribbon-like hexagon is obtained in a plan view when connecting an inner sidewall of the first support hole with central points of the cross-sections of the pillars exposed through the first support hole.

20 Claims, 24 Drawing Sheets

Related U.S. Application Data which is a continuation of application No. 15/712,479, filed on Sep. 22, 2017, now Pat. No. 10,340,277.

(51) Int. Cl.
*H01L 23/528* (2006.01)
*H01L 21/768* (2006.01)
*H01L 29/41* (2006.01)
*H01L 27/02* (2006.01)

(52) U.S. Cl.
CPC ...... *H01L 23/528* (2013.01); *H01L 27/10852* (2013.01); *H01L 28/90* (2013.01); *H01L 29/41* (2013.01); *H01L 27/0207* (2013.01)

(56) References Cited

U.S. PATENT DOCUMENTS

| | | |
|---|---|---|
| 8,766,343 B2 | 7/2014 | Kang et al. |
| 8,779,549 B2 | 7/2014 | Kim et al. |
| 9,087,729 B2 | 7/2015 | Park et al. |
| 9,142,558 B2 | 9/2015 | Yang et al. |
| 9,276,058 B2 | 3/2016 | Lee et al. |
| 10,340,277 B2 | 7/2019 | Song et al. |
| 10,720,435 B2 * | 7/2020 | Song ................ H01L 21/76802 |
| 2018/0158829 A1 | 6/2018 | Song et al. |

OTHER PUBLICATIONS

USPTO Notice of Allowance dated Mar. 16, 2020 for parent U.S. Appl. No. 16/440,399.

* cited by examiner

SEMICONDUCTOR DEVICES INCLUDING SUPPORT PATTERNS

CROSS-REFERENCE TO RELATED APPLICATIONS

This U.S. non-provisional patent application is a continuation-in-part application of U.S. patent application Ser. No. 16/440,399, filed Jun. 13, 2019, which is a continuation of U.S. patent application Ser. No. 15/712,479, filed Sep. 22, 2017, now U.S. Pat. No. 10,340,277 B2 issued Jul. 2, 2019, which claims priority under 35 U.S.C. § 119 to Korean Patent Application No. 10-2016-0163751 filed on Dec. 2, 2016, in the Korean Intellectual Property Office, the entire contents of each of which are hereby incorporated by reference.

BACKGROUND

1. Field

The present disclosure relates to a semiconductor device including a support pattern.

2. Description of the Related Art

Semiconductor devices are considered to be an important factor in electronic industry because of their small size, multi-function, and/or low fabrication cost. The semiconductor devices are being highly integrated with the development of the electronic industry, e.g., line widths of patterns of the semiconductor devices are reduced for high integration of the semiconductor devices. However, new exposure techniques and/or expensive exposure techniques are required to reduce line widths of the patterns to facilitate high integration of the semiconductor devices. Thus, research has been conducted for new integration techniques, e.g., to bury word lines inside a semiconductor substrate in dynamic random-access memory (DRAM) memory devices.

SUMMARY

According to some example embodiments of the present inventive concepts, a semiconductor device may comprise: a plurality of pillars on a semiconductor substrate; and a support pattern in contact with at least one side surface of each of the pillars, the support pattern connecting the pillars with one another. The support pattern may include a plurality of support holes that expose side surfaces of the pillars. The support holes may include a first support hole and a second support hole that are spaced apart from each other. The pillars may have circular cross-sections. A ribbon-like hexagon may be obtained in a plan view when connecting an inner sidewall of the first support hole with central points of the cross-sections of the pillars exposed through the first support hole.

According to some example embodiments of the present inventive concepts, a semiconductor device may comprise: a plurality of pillars on a semiconductor substrate; and a support pattern in contact with at least one side surface of each of the pillars, the support pattern connecting the pillars with one another. The support pattern may include a plurality of support holes that expose side surfaces of the pillars. The support holes may include a plurality of first support holes and at least one second support hole that are spaced apart from each other. The first support holes may have a different shape from that of the second support hole. An opening area of the second support hole may be the same as or greater than that of the first support hole.

According to some example embodiments of the present inventive concepts, a semiconductor device may comprise: a plurality of pillars on a semiconductor substrate; and a support pattern in contact with at least one side surface of each of the pillars, the support pattern connecting the pillars with one another. The support pattern may include a plurality of support holes that expose side surfaces of the pillars. The support holes may include a plurality of first support holes and at least one second support hole that are spaced apart from each other. The first support holes may have a different shape from that of the second support hole. An opening area of the second support hole may be different from that of the first support hole.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Exemplary embodiments will be described hereinafter in detail in conjunction with the accompanying drawings.

Figure 1:
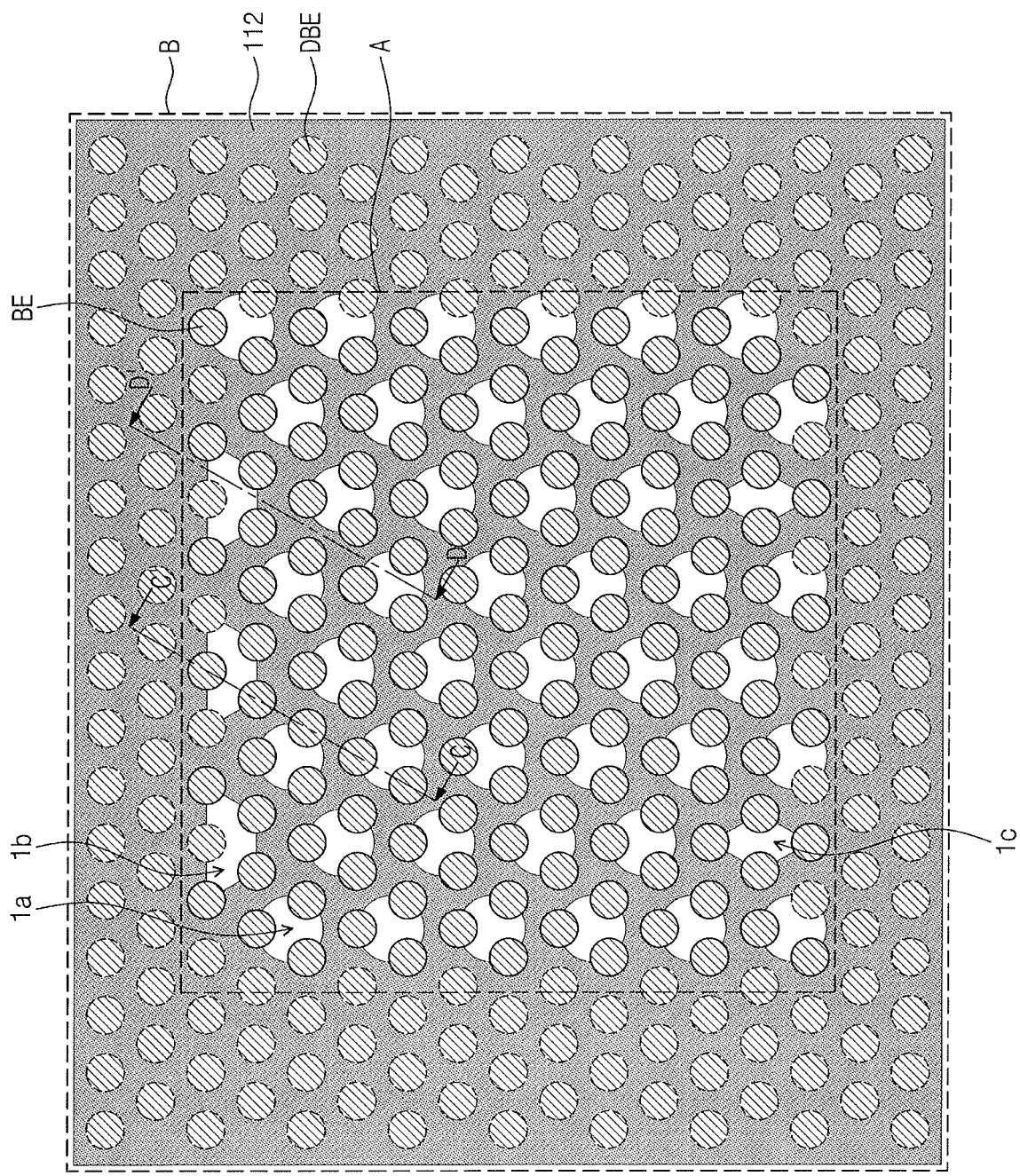
FIG. 1 illustrates a plan view of a semiconductor device according to exemplary embodiments.
Figure 2:
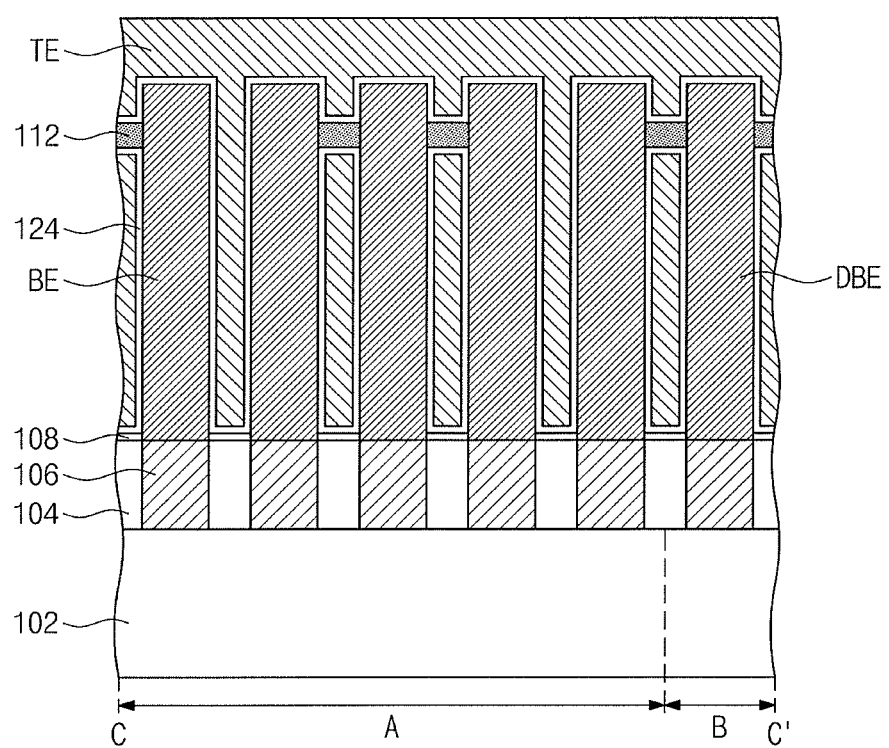
FIG. 2 illustrates a cross-sectional view taken along line C-C' of FIG. 1.
Figure 3:
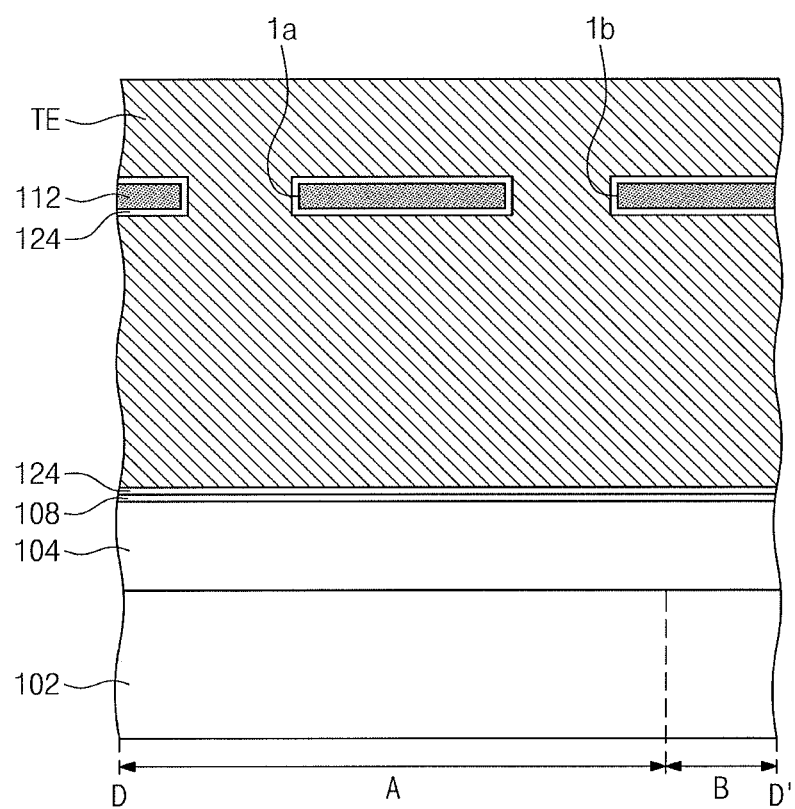
FIG. 3 illustrates a cross-sectional view taken along line D-D' of FIG. 1.
Figure 4:
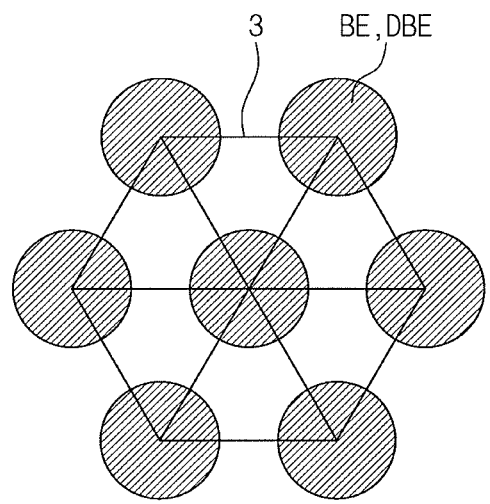
FIG. 4 illustrates a plan view of an arrangement of bottom electrodes of FIG. 1.

FIG. 1 is a plan view illustrating a semiconductor device according to exemplary embodiments. FIG. 2 is a cross-sectional view taken along line C-C' of FIG. 1. FIG. 3 is a cross-sectional view taken along line D-D' of FIG. 1. FIG. 4 is a plan view illustrating an arrangement of lower electrodes of FIG. 1.

Referring to FIGS. 1 to 4, a semiconductor substrate 102 may be provided. The semiconductor substrate 102 may include an actual cell region A and a dummy cell region B. The dummy cell region B may surround the actual cell region A, as illustrated in FIG. 1. The actual cell region A and the dummy cell region B may be disposed on a memory block section of a cell array area. A peripheral circuit area or a core area may be located outside the dummy cell region B. The actual cell region A may be a region where actual memory cells are arranged and operated. The dummy cell region B may have a structure similar to that of the actual cell region A and be a region where inoperable dummy memory cells are arranged. The dummy memory cells may be formed to prevent pattern shapes, e.g., in the actual cell region A, from being distorted due to interference or diffraction of light at an edge area of a cell memory region during a photolithography process. In addition, in an etch process, the cell memory region may have a different etching condition in its edge area than in its central area, e.g., thereby causing an electrical bridge between patterns. Accordingly, the dummy memory cells may be formed to make the edge area of the cell memory region to have the same etching condition as that in the central area of the cell memory region, e.g., the dummy cell region B may be the edge area of the actual cell region A to facilitate a same etching condition through the entire actual cell region A.

The semiconductor substrate 102 may be, e.g., a single crystalline silicon substrate. An interlayer dielectric layer 104 may be disposed on the semiconductor substrate 102. The interlayer dielectric layer 104 may be formed of, e.g., a silicon oxide layer. A plurality of bottom electrode contacts 106 penetrate the interlayer dielectric layer 104 to be electrically connected to the semiconductor substrate 102. The bottom electrode contacts 106 may include at least one of an impurity-doped polysilicon pattern, a titanium nitride layer, and a tungsten layer.

Although not shown in the figures, the semiconductor substrate 102 may be provided therein with a device isolation layer defining active regions. Word lines may be buried in the semiconductor substrate 102. A gate dielectric layer and a capping pattern may insulate the word lines from the semiconductor substrate 102. Source/drain regions may be provided to include impurity regions disposed in the semiconductor substrate 102 on opposite sides of each of the word lines. The impurity regions on sides of the word lines may be electrically connected to corresponding bit lines. The bottom electrode contacts 106 may be electrically connected to the impurity regions on other sides of the word lines.

An etch stop layer 108 may be disposed on the interlayer dielectric layer 104. The etch stop layer 108 may be formed of, e.g., a silicon nitride layer. Bottom electrodes BE and DBE penetrate the etch stop layer 108 to be in contact with corresponding bottom electrode contacts 106, respectively. In this description, the bottom electrodes BE disposed on the actual cell region A are referred to as actual bottom electrodes BE, and the bottom electrodes DBE disposed on the dummy cell region B are referred to as dummy bottom electrodes DBE. It is noted that in FIG. 1 the actual bottom electrode BE is illustrated by a solid border line and the dummy bottom electrode DBE is illustrated by a dotted border line. Some of the dummy bottom electrodes DBE may be arranged on the actual cell region A, and disposed on an edge portion of the actual cell region A so as to be adjacent to the dummy cell region B. All of the bottom electrodes BE and DBE may have the same shape and be formed of the same material. For example, the bottom electrodes BE and DBE may be formed of titanium nitride or impurity-doped polysilicon.

The bottom electrodes BE and DBE may be electrode pillars, i.e., pillar structures. That is, the bottom electrodes BE and DBE may have a pillar shape with a circular cross-section in plan view and a plug shape without an internal cavity in a cross-sectional view (FIG. 2). The bottom electrodes BE and DBE may include memory pillar structures on the actual cell region A and dummy pillar structures on the dummy cell region B, respectively. The memory pillar structures may perform memory functions, while the dummy pillar structures may not perform memory functions.

Referring to FIG. 4, the bottom electrodes BE and DBE may be spaced apart from each other at the same interval. That is, the bottom electrodes BE and DBE may have a cross-section of a circle in plan view, and straight lines 3 connecting central points of most adjacent circles may be the same, e.g., distances between central points of every two adjacent circles may be the same. A hexagonal honeycomb shape may be obtained when connecting the central points of six bottom electrodes BE and DBE surrounding a central bottom electrode BE or DBE. As the bottom electrodes BE and DBE are spaced apart from each other at the same interval, a dielectric layer and a top electrode layer may be formed to have a uniform thickness in subsequent processes.

As illustrated in FIGS. 1-2, the bottom electrodes BE and DBE may have an upper sidewall in contact with a support pattern 112, e.g., the support pattern 112 may extent to contact upper portions of upper sidewalls of adjacent ones of the bottom electrodes BE and DBE to support the bottom electrodes BE and DBE. The support pattern 112 may be formed of, e.g., a silicon nitride layer. The support pattern 112 may be in contact with sidewalls of all of the bottom electrodes BE and DBE. The support pattern 112 may include support holes 1*a*, 1*b*, and 1*c*, as shown in FIG. 1. It is noted that that support pattern 112 is indicated in solid gray in FIG. 1.

In detail, as illustrated in FIG. 1, the support holes 1*a*, 1*b*, and 1*c* may be disposed on the actual cell region A, but not on the dummy cell region B. That is, the support holes 1*a*, 1*b*, and 1*c* may be disposed only on the actual cell region A, so no support holes 1*a*, 1*b*, and 1*c* (or portions thereof) may be on the dummy cell region B. In the actual cell region A, the support holes 1*a*, 1*b*, and 1*c* may partially expose side surfaces of all of the actual bottom electrodes BE, e.g., the support holes 1*a* to 1*c* may be formed so that a portion of a side surface of each of the actual bottom electrodes BE faces the support hole. The support holes 1*a*, 1*b*, and 1*c* may expose some dummy electrodes DBE arranged on the actual cell region A.

The support holes 1*a*, 1*b*, and 1*c* may include a first support hole 1*a*, a second support hole 1*b*, and a third support hole 1*c*. The first to third support holes 1*a* to 1*c* may have different planar shapes from each other. The first support hole 1*a* may be provided in plural. The first support hole 1*a* may be a major hole occupying most of the support holes 1*a*, 1*b*, and 1*c*, e.g., a majority of support holes of the total of the support holes 1*a* to 1*c* are the first support holes 1*a*. For example, a total number of the first support holes 1*a* may be larger than that of the second support holes 1*b* and/or third support holes 1*c*. The first support holes 1*a* may be arranged on a central portion of the actual cell region A. Some of the first support holes 1a may also be disposed on the edge portion of the actual cell region A. The actual cell region A may be provided at its edge portion with at least one second and third support holes 1b and 1c.

FIGS. 5 to 11 are plan views illustrating a relationship between the bottom electrodes BE, DBE and the support holes 1a through 1c.

Figure 5:
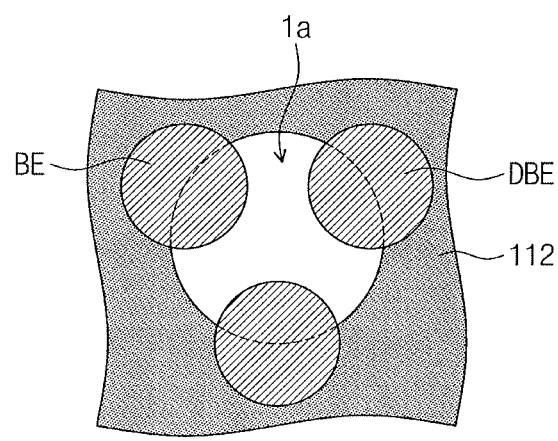
FIGS. 5 to 11 illustrate plan views of a relationship between bottom electrodes and a support hole.

Referring to FIG. 5, a circle may be obtained in plan view when connecting a sidewall of the first support hole 1a with central points of the bottom electrodes BE and DBE exposed through the first support hole 1a. For example, the first support hole 1a may have a cross-section of a circle in a plan view, with a perimeter of the circle extending through central points of three adjacent bottom electrodes BE and DBE, and with a center of the circle being in a center of a region between the three adjacent bottom electrodes BE and DBE. The first support hole 1a may partially expose sidewalls of the three adjacent bottom electrodes BE and DBE.

Figure 6:
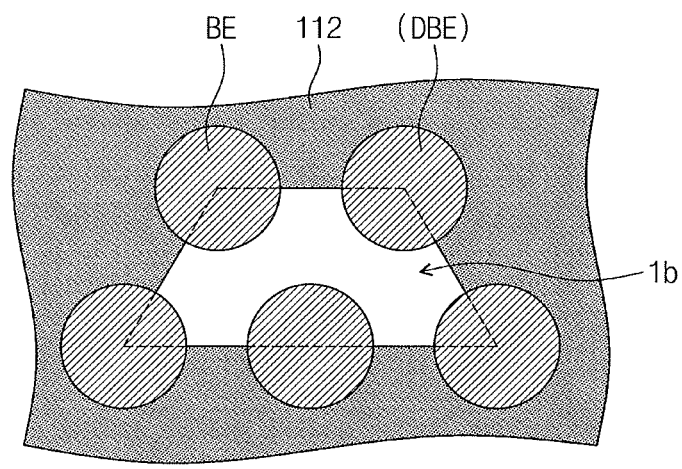

Referring to FIG. 6, a quadrangle connecting five bottom electrodes BE and DBE may be obtained in plan view when connecting a sidewall of the second support hole 1b with central points of the bottom electrodes BE and DBE exposed through the second support hole 1b. For example, the second support hole 1b may have a cross-section of a trapezoid in a plan view, with a first side of the trapezoid connecting central points of two adjacent bottom electrodes BE and DBE, and a second side of the trapezoid parallel to the first side and connecting central points of three adjacent bottom electrodes BE and DBE. The second support hole 1b may partially expose sidewalls of five bottom electrodes BE and DBE.

Figure 7:
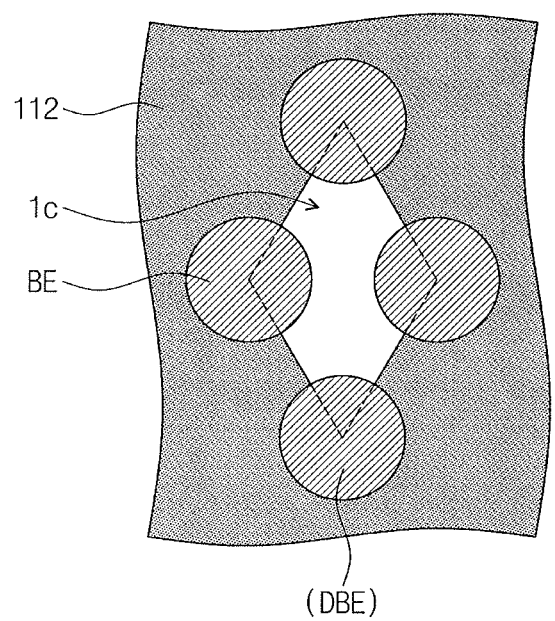

Referring to FIG. 7, a quadrangle connecting four bottom electrodes BE and DBE may be obtained in plan view when connecting a sidewall of the third support hole 1c with central points of the bottom electrodes BE and DBE exposed through the third support hole 1c. For example, the third support hole 1c may have a cross-section of a rhombus in a plan view, with each side of the rhombus connecting central points of two adjacent bottom electrodes BE and DBE.

The support holes 1a, 1b, and 1c may not be limited thereto but variously changed. This will be described below with reference to FIGS. 8-11.

Figure 8:
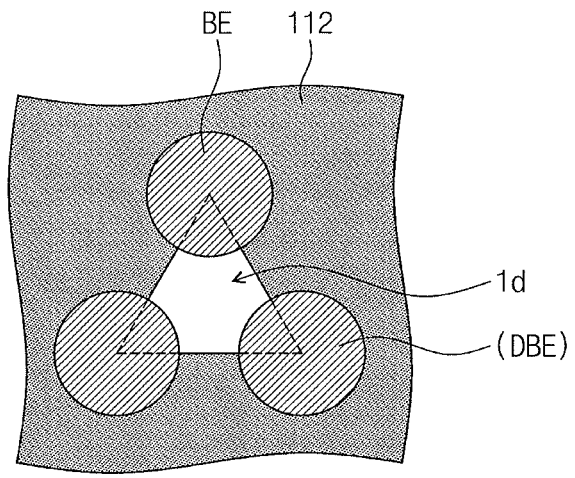

Referring to FIG. 8, the support pattern 112 may include a fourth support hole 1d. An equilateral triangle may be obtained in plan view when connecting a sidewall of the fourth support hole 1d with central points of the bottom electrodes BE and DBE exposed through the fourth support hole 1d. For example, the fourth support hole 1d may have a cross-section of an equilateral triangle in a plan view, with each side of the equilateral triangle connecting central points of two adjacent bottom electrodes BE and DBE.

Figure 9:
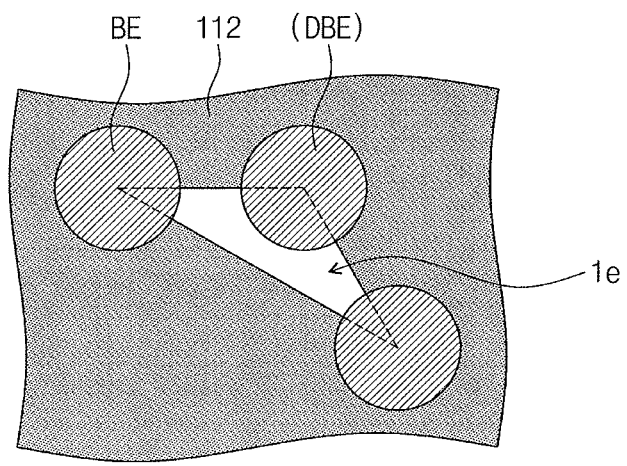

Referring to FIG. 9, the support pattern 112 may include a fifth support hole 1e. An isosceles triangle (with one angle of 120°) may be obtained in plan view when connecting a sidewall of the fifth support hole 1e with central points of the bottom electrodes BE and DBE exposed through the fifth support hole 1e. For example, the fifth support hole 1e may have a cross-section of an isosceles triangle in a plan view, with each side of the equilateral triangle connecting central points of two adjacent bottom electrodes BE and DBE.

Figure 10:
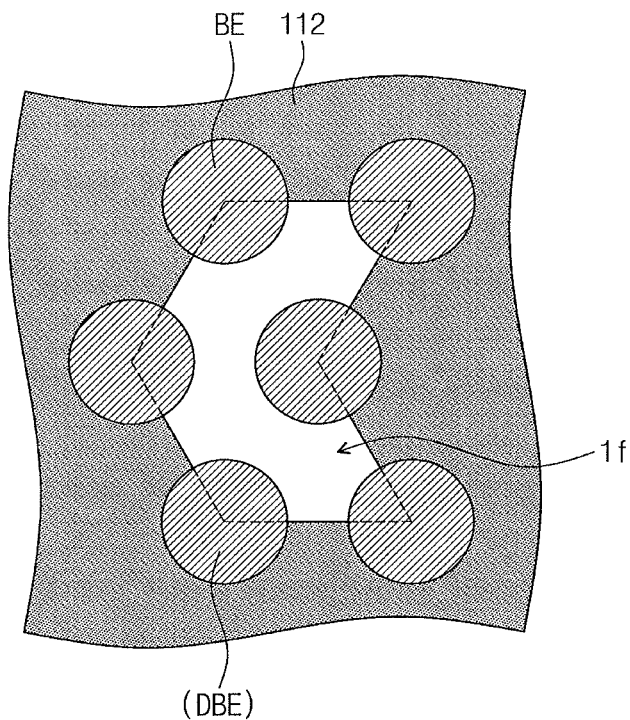

Referring to FIG. 10, the support pattern 112 may include a sixth support hole 1f. A distorted hexagon may be obtained in plan view when connecting a sidewall of the sixth support hole 1f with central points of the bottom electrodes BE and DBE exposed through the sixth support hole 1f. For example, the sixth support hole 1f may have a cross-section of a distorted hexagon in a plan view, with each side of the hexagon connecting central points of two adjacent bottom electrodes BE and DBE.

Figure 11:
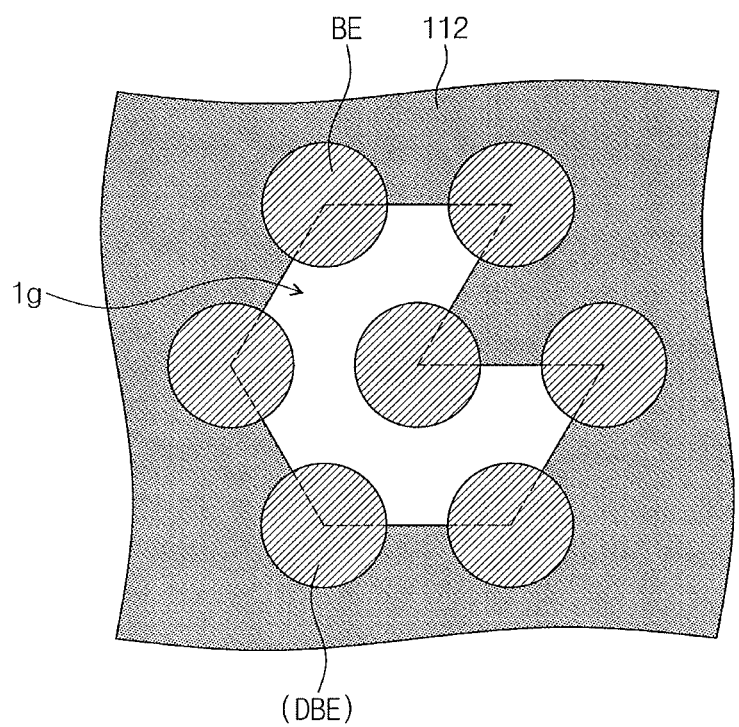

Referring to FIG. 11, the support pattern 112 may include a seventh support hole 1g. A distorted heptagon may be obtained in plan view when connecting a sidewall of the seventh support hole 1g with central points of the bottom electrodes BE and DBE exposed through the seventh support hole 1g. For example, the seventh support hole 1g may have a cross-section of a distorted heptagon in a plan view, with each side of the heptagon connecting central points of two adjacent bottom electrodes BE and DBE.

At least one of the second to seventh support holes 1b to 1g may be disposed on the edge portion of the actual cell region A in the support pattern 112 of FIG. 1. One of the support holes 1a to 1g may partially expose the sidewalls of three to seven bottom electrodes BE and DBE at the same time. The number of the support holes 1a to 1g may be at least one.

Referring back to FIG. 2, a dielectric layer 124 may conformally cover exposed surfaces of the support pattern 112 and exposed surfaces of the bottom electrodes BE and DBE, and a top electrode layer TE may be formed on dielectric layer 124, e.g., to fill a space between the bottom electrodes BE and DBE and extend above the bottom electrodes BE and DBE. That is, the support holes 1a, 1b, and 1c partially expose side surfaces of all of the actual bottom electrodes BE during manufacturing stages, so the dielectric layer 124 may conformally cover the exposed surfaces of the bottom electrodes BE and DBE that face the support holes. For example, FIG. 2 illustrates a portion of a first support hole 1a (between the two most left actual bottom electrodes BE) filled with the dielectric layer 124 and the top electrode layer TE. The dielectric layer 124 may be formed of, e.g., a metal oxide layer such as an aluminum oxide layer, which exhibits a dielectric constant greater than that of a silicon oxide layer. The top electrode layer TE may be formed of at least one of, e.g., a titanium nitride layer, a tungsten layer, an impurity-doped polysilicon layer, and an impurity-doped silicon germanium layer.

As discussed above, in a semiconductor device according to an exemplary embodiment, the support pattern 112 supporting the bottom electrodes BE and DBE may include at least one of the support holes 1a to 1g having different shapes from each other, e.g., at least two of the support holes in the support pattern 112 may have shapes that are different from each other. As such, without extending into the dummy cell region B, the support holes 1a to 1g may all be positioned in the actual cell region A to expose side surfaces of all of the actual bottom electrodes BE serving as a memory on the actual cell region A. In addition, as shapes of the support holes in the support pattern 112 are not all identical to each other, at least one of the shapes of the support holes in the support pattern 112 may be adjusted to ensure that all of the support holes of the support pattern 112 are within the actual cell region A without extending into the dummy cell region B, thereby eliminating a need to horizontally extend a width of the support pattern 112 into a peripheral circuit area. Further, as the support holes 1a to 1g expose the side surfaces of all of the actual bottom electrodes BE in the actual cell region A, the dielectric layer 124 and the top electrode layer TE may be deposited to have a uniform thickness without collapse of the bottom electrodes BE.

Figure 12:
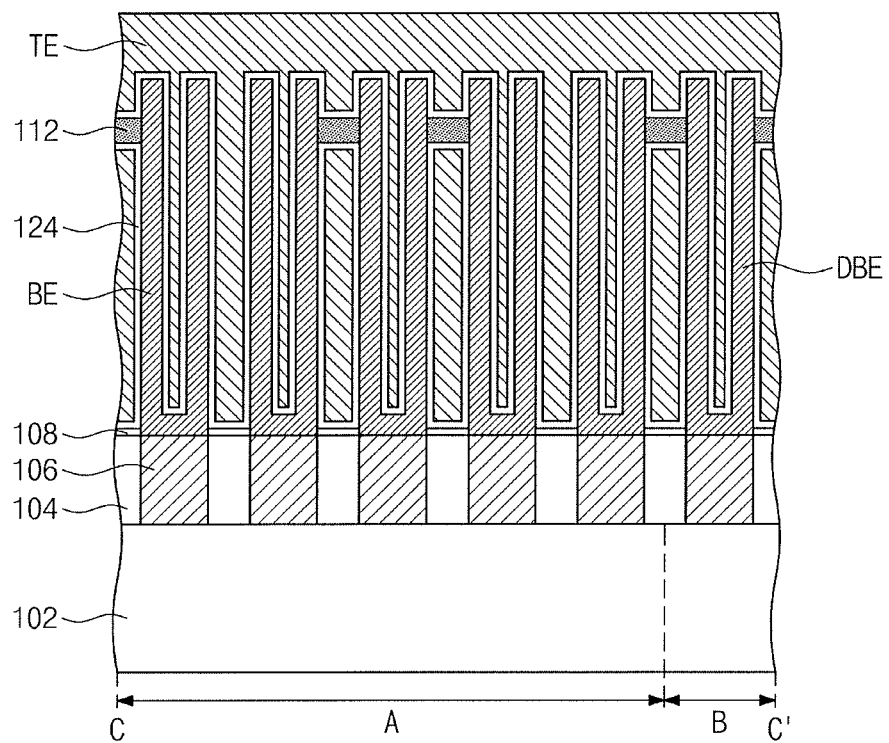
FIG. 12 illustrates a cross-sectional view of a semiconductor device according to other exemplary embodiments along line C-C' of FIG. 1.

FIG. 12 illustrates a cross-sectional view of a semiconductor device according to other exemplary embodiments along line C-C' of FIG. 1. Referring to FIG. 12, the bottom electrodes BE and DBE may have a hollow cup shape. The dielectric layer 124 and the top electrode layer TE may also be formed to conform to internal surfaces of the bottom electrodes BE and DBE.

FIGS. 13 to 16 are cross-sectional views illustrating stages in a method of fabricating a semiconductor device having the cross-section of FIG. 2. FIG. 17 is a plan view illustrating a mask pattern used for forming a support hole according to exemplary embodiments.

Figure 13:
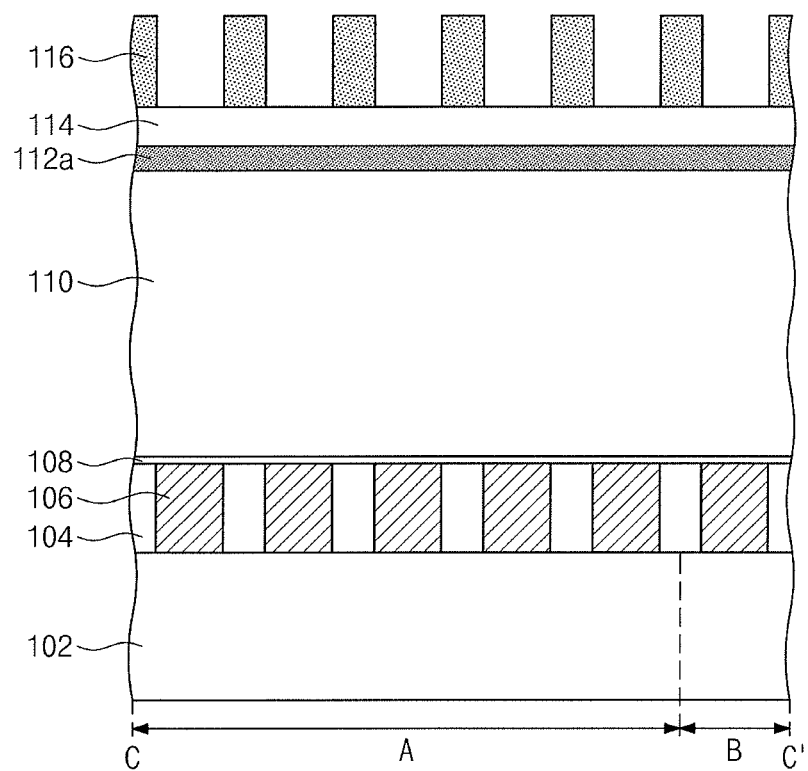
FIGS. 13 to 16 illustrate cross-sectional views of stages in a method of fabricating a semiconductor device having the cross-section of FIG. 2.

Referring to FIG. 13, the semiconductor substrate 102 may be provided. Although not shown in figures, active regions may be defined by forming a device isolation layer in the semiconductor substrate 102. Word lines may be formed in the semiconductor substrate 102. The word lines may be insulated from the semiconductor substrate 102 through a gate dielectric layer and a capping pattern. Impurity regions may be formed in the semiconductor substrate 102 on opposite sides of each of the word lines. Bit lines may be formed on the semiconductor substrate 102 and thus electrically connected to the impurity regions on the sides of the word lines.

The interlayer dielectric layer 104 may be formed on the semiconductor substrate 102. The interlayer dielectric layer 104 may be etched to form contact holes exposing the impurity regions on the sides of the word lines in the substrate 102, and the contact holes may be filled with a conductive material, followed by a planarization process of the conductive material to form the bottom electrode contacts 106, e.g. tops of the bottom electrode contacts 106 may be level with a top of the interlayer dielectric layer 104.

The etch stop layer 108 may be formed on the interlayer dielectric layer 104 and on the bottom electrode contacts 106. A first mold layer 110, a support layer 112a, and a second mold layer 114 may be sequentially formed on, e.g., directly on, the etch stop layer 108. The etch stop layer 108 may be formed of a material having an etch selectivity with respect to the first mold layer 110. For example, the etch stop layer 108 may be formed of a silicon nitride layer, and the first and second mold layers 110 and 114 may be formed of a silicon oxide-based material. When polysilicon is not used to form bottom electrodes BE and DBE which will be discussed below, the first and second mold layers 110 and 114 may be formed of a polysilicon layer or a silicon germanium layer. The support layer 112a may be formed of, e.g., a silicon nitride layer. A first mask pattern 116 may be formed on the second mold layer 114 so as to define openings for bottom electrode holes which will be discussed below, e.g., the openings of the mask patterns 116 may overlap the bottom electrode contacts 106. The first mask pattern 116 may include, e.g., a photoresist pattern.

Figure 14:
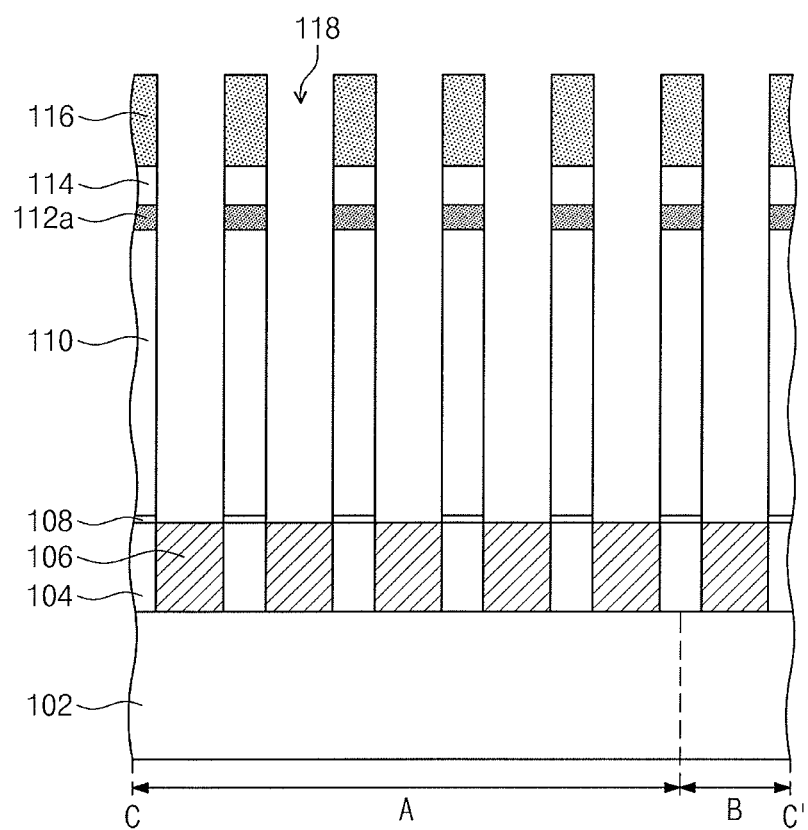

Referring to FIG. 14, the first mask pattern 116 may be used as an etch mask to sequentially pattern the second mold layer 114, the support layer 112a, and the first mold layer 110, thereby exposing the etch stop layer 108. Then, the exposed etch stop layer 108 may be etched to form bottom electrode holes 118 exposing top surfaces of the bottom electrode contacts 106.

Figure 15:
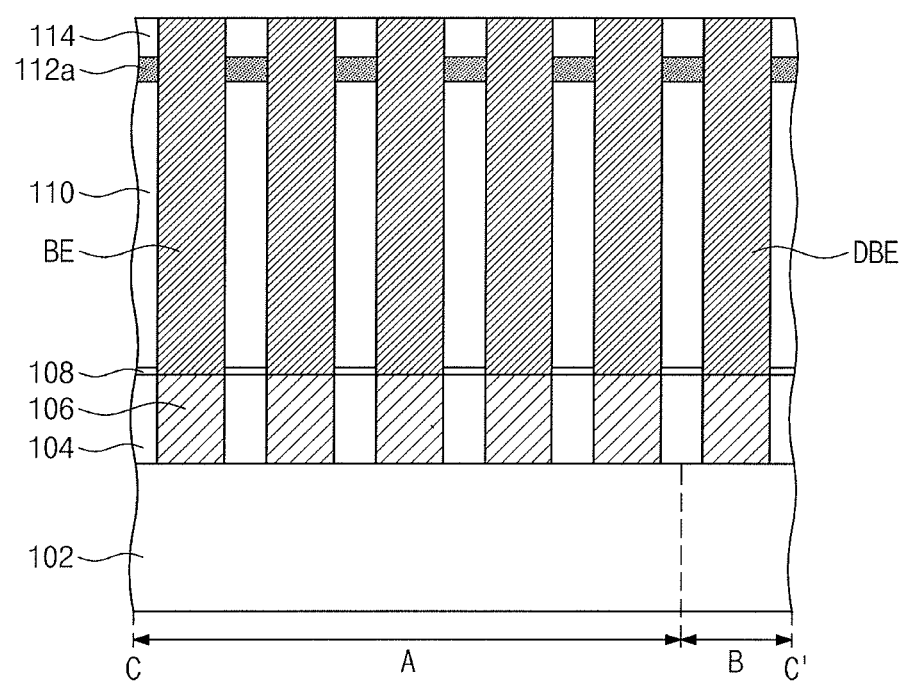

Referring to FIG. 15, the first mask pattern 116 may be removed. For example, when the first mask pattern 116 is formed of a photoresist pattern, an ashing process may be employed to remove the first mask pattern 116. Thus, a top surface of the second mold layer 114 may be exposed. Subsequently, a conductive layer may be formed, e.g., stacked, in the bottom electrode holes 118, e.g., to completely fill the bottom electrode holes 118, followed by a planarization etch process on the conductive layer to expose the top surface of the second mold layer 114, and simultaneously, to form bottom electrodes BE, DBE in corresponding bottom electrode holes 118.

Figure 16:
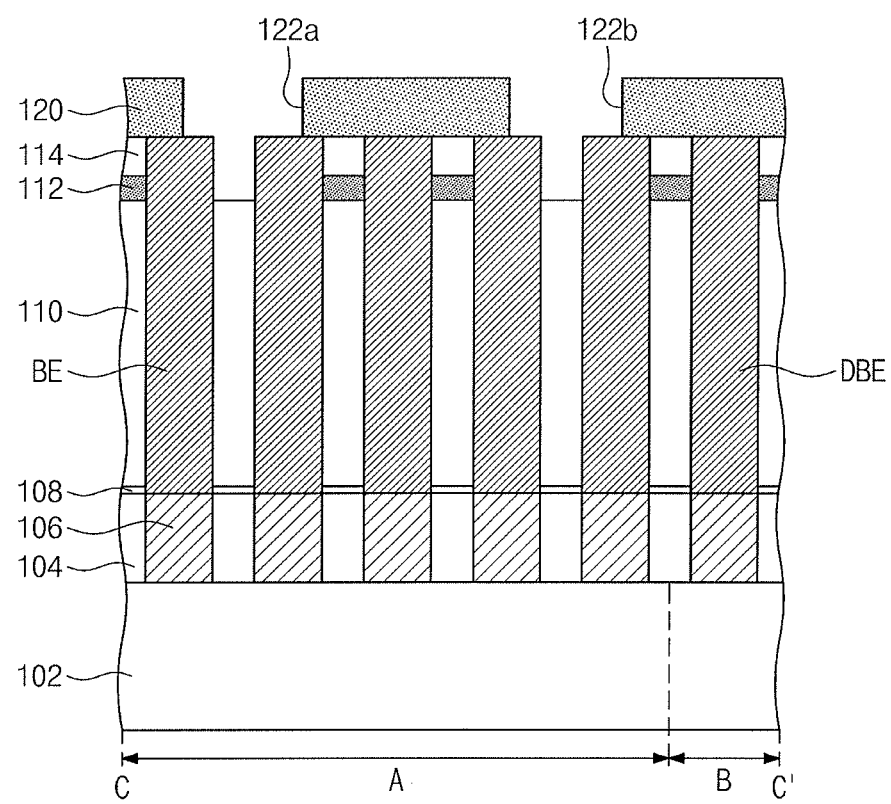
Figure 17:
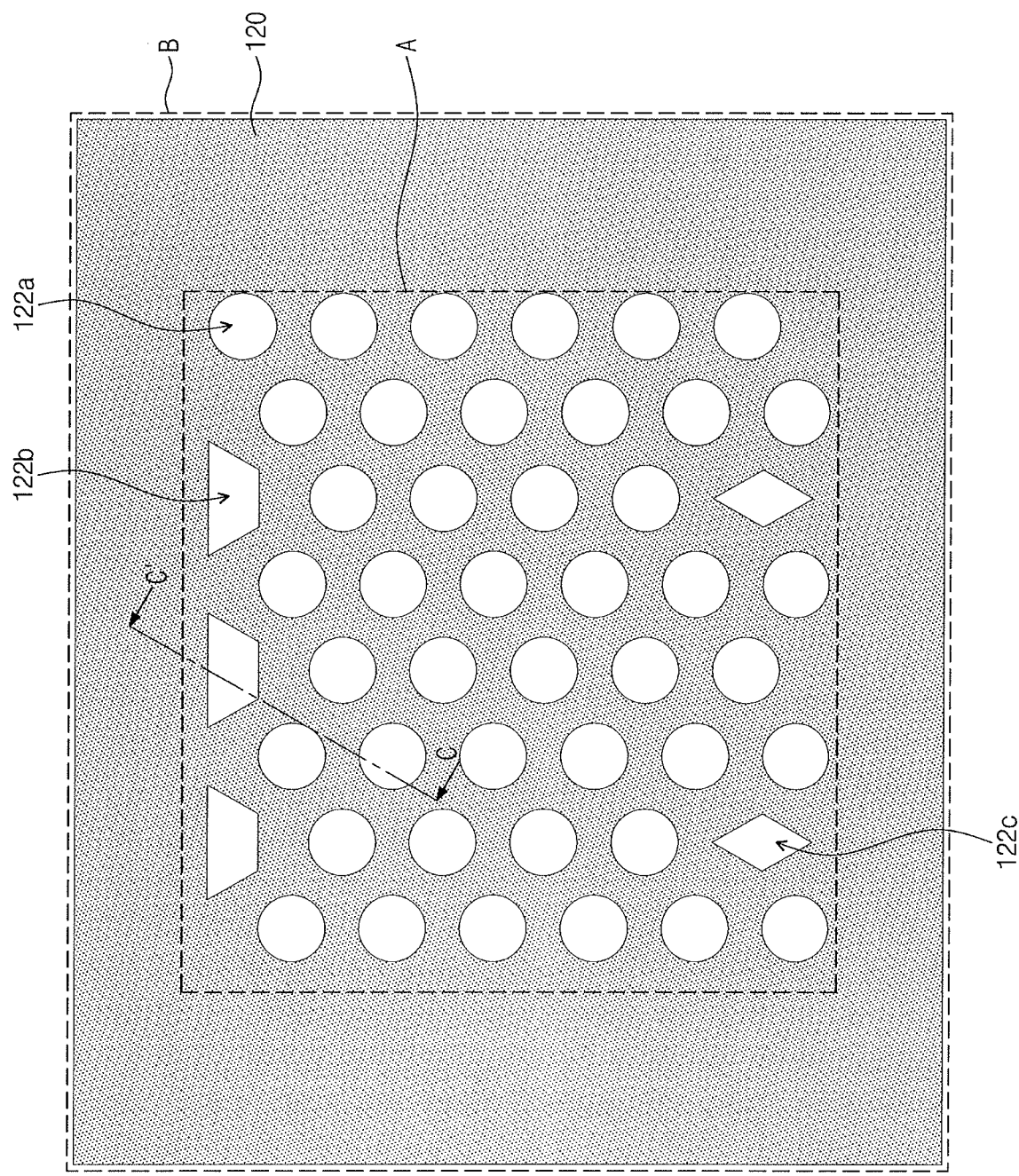
FIG. 17 illustrates a plan view of a mask pattern used for forming a support hole according to exemplary embodiments.

Referring to FIGS. 16 and 17, a second mask pattern 120 may be formed on the bottom electrodes BE, DBE, and on the second mold layer 114. The second mask pattern 120 may have openings defining shapes of the support holes 1a to 1g disclosed in FIGS. 1 and 5 to 11. For example, when only the first to third support holes 1a to 1c are included in the support pattern 112 discussed below, the second mask pattern 120 may include first, second, and third mask holes 122a, 122b, and 122c having shapes and positions correspond to those of the first to third support holes 1a to 1c. For example, as illustrated in FIG. 17, the first mask hole 122a may have a circular shape, the second mask hole 122b may have a trapezoidal shape, and the third mask hole 122c may have a rhombus shape. The first to third mask holes 122a, 122b, and 122c may be positioned to overlap only portions of the actual cell region A. As the second and third mask holes 122b and 122c have shapes, e.g., polygonal shapes, different from that (i.e., the circular shape) of the first mask hole 122a, the first to third mask holes 122a, 122b, and 122c may be disposed only in the actual cell region A.

A photolithography process may be performed to form the first to third mask holes 122a to 122c in the second mask pattern 120 according to embodiments. In general, accounting for a process margin of the photolithography process, which may potentially cause some of the mask holes at least partially extend into, e.g., overlap, a dummy cell region, a horizontal width of the support pattern may be extended toward a peripheral area or a core area. That is, accounting for the process margin of the photolithography process, if all of the mask holes were to have the same shape (e.g., circle), some of such mask holes would extend into, e.g., at least partially overlap, the dummy cell region in order to expose sidewalls of all of the actual bottom electrodes BE, thereby requiring the horizontal width of the support pattern to extended toward a peripheral area or a core area.

However, according to example embodiments, some shapes of the mask holes at edges of the actual cell region A, e.g., the second and third mask holes 122b and 122c, may be modified to be other than circular in order to remain positioned within the actual cell region A, while also exposing sidewalls of all of the actual bottom electrodes BE. IN other words, as all of the first to third mask holes 122a to 122c are positioned within the actual cell region A, i.e., none of the first to third mask holes 122a to 122c extends beyond the actual cell region A, due to the different shapes of the first to third mask holes 122a to 122c, the horizontal width of the support pattern 122 does not have to be extended, thereby facilitating high integration.

The second mask pattern 120 may be used as an etch mask to remove portions of the second mold layer 114 exposed through the first to third mask holes 122a to 122c and to also remove portions of the support layer 112 below the removed second mold layer 114. As a result, a top surface of the first mold layer 110 may be exposed through the resultant opening, and at the same time, the support pattern 112 may be formed to include the first to third support holes 1a to 1c of FIG. 1.

Referring back to FIGS. 1 and 3, the second mask pattern 120 may be removed to expose some of a side surface of the bottom electrodes BE and DBE, tops of remaining portions of the second mold layer 114, and the top surface of the first mold layer 110. An isotropic etch process may be performed to completely remove the first and second mold layers 110 and 114 to expose top and side surfaces of the bottom electrodes BE and DBE, a top surface of the etch stop layer 108, and top, bottom, and side surfaces of the support pattern 112, e.g., FIG. 3 illustrates portions of the support pattern 112 having side surfaces exposed through the support holes. In this step, the support pattern 112 contacts upper portions of sidewalls of, e.g., connects adjacent ones of, the bottom electrodes BE and DBE to prevent collapse of the bottom electrodes BE and DBE. As the support holes 1a to 1c partially expose the side surfaces of all of the actual bottom electrodes BE, an etchant or etching gas may be provided through the support holes 1a to 1c toward the side surfaces of all of the actual bottom electrodes BE. Therefore, regardless of position in the actual cell region A, the first and second mold layers 110 and 114 may be, e.g., completely, removed at a uniform concentration profile or etch rate in the vicinity of the side surfaces of the actual bottom electrodes BE. Thus, it may be possible to prevent some of the actual bottom electrodes BE from being excessively damaged.

The dielectric layer 124 may conformally cover exposed surfaces of the support pattern 112 and exposed surfaces of the bottom electrodes BE and DBE, and the top electrode layer TE may be sequentially formed on the dielectric layer 124. A semiconductor device may therefore be fabricated to have high integration and reliability.

Figure 18A:
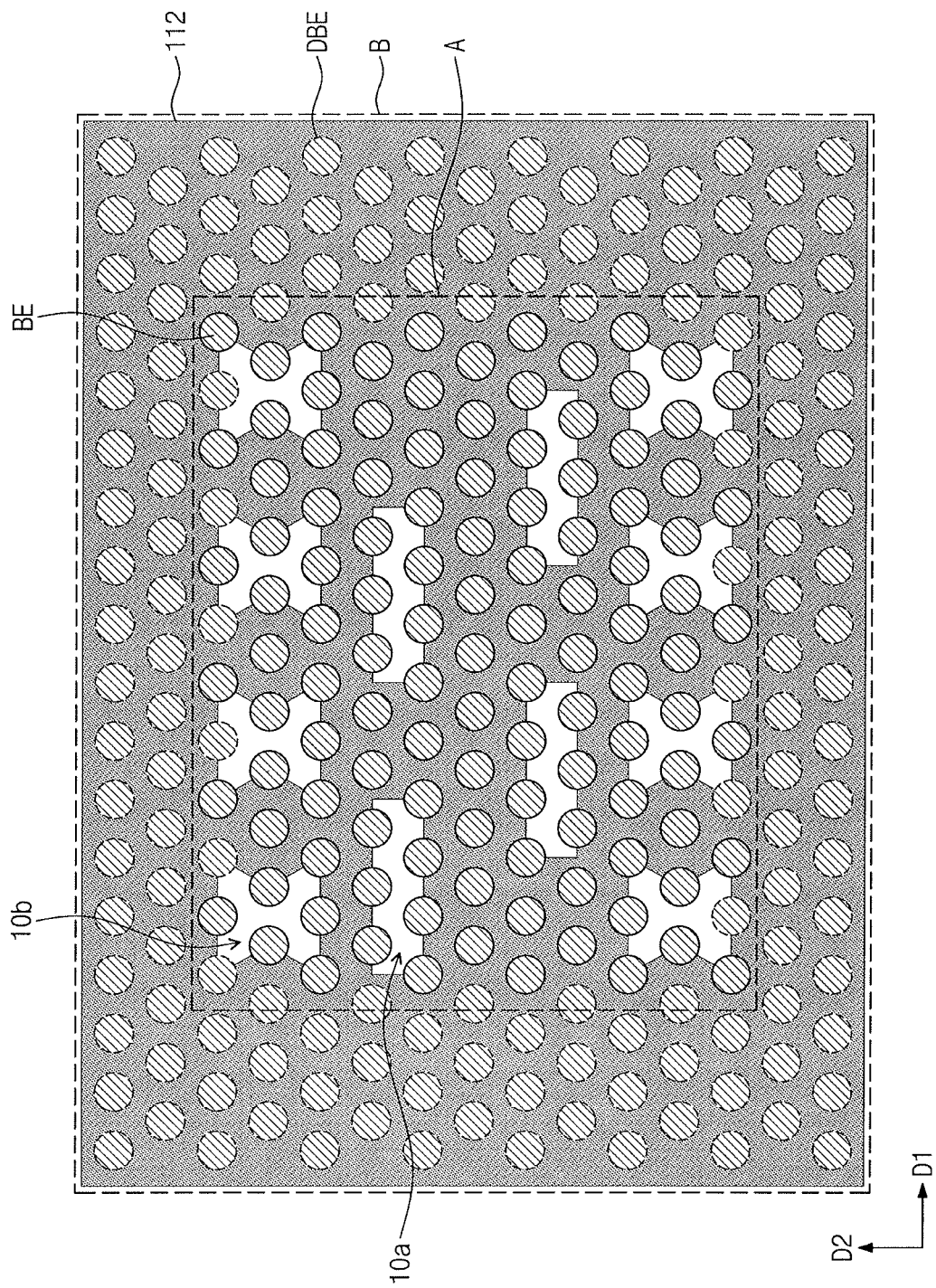
FIG. 18A illustrates a plan view of a semiconductor device according to exemplary embodiments.
Figure 18B:
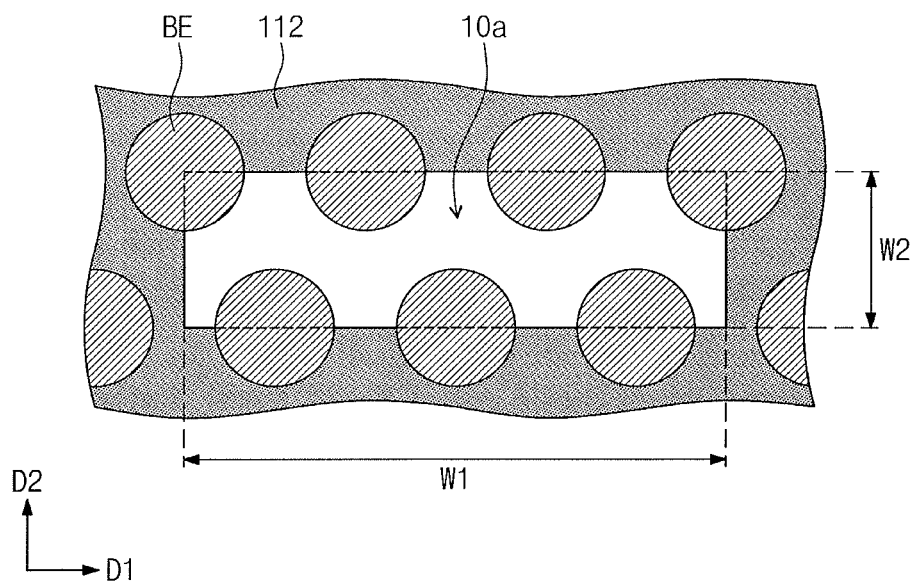
FIG. 18B illustrates an enlarged view of a first support hole of FIG. 18A.
Figure 18C:
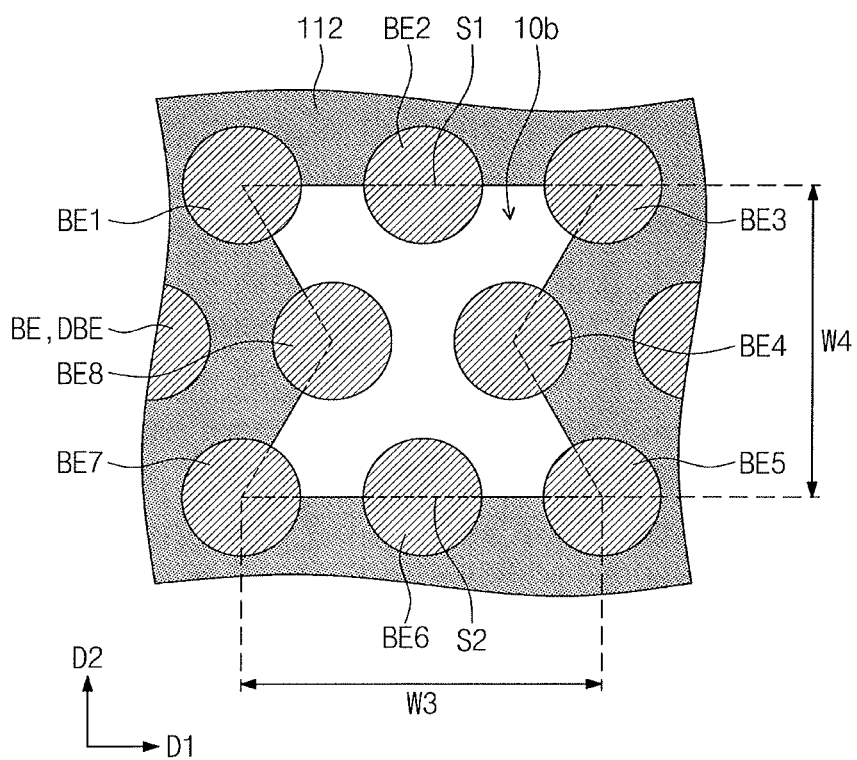
FIG. 18C illustrates an enlarged view of a second support hole of FIG. 18A.

FIG. 18A illustrates a plan view of a semiconductor device according to exemplary embodiments. FIG. 18B illustrates an enlarged view of a first support hole of FIG. 18A. FIG. 18C illustrates an enlarged view of a second support hole of FIG. 18A.

Referring to FIGS. 18A to 18C, the support pattern 112 may include a first support hole 10a and a second support hole 10b that expose the bottom electrodes BE and DBE. A plurality of first support holes 10a may be provided close to the central portion of the actual cell region A. A plurality of second support holes 10b may be provided adjacent to the dummy cell region B.

The first support hole 10a may expose the actual bottom electrodes BE. For example, the first support hole 10a may partially and simultaneously expose the side surfaces of seven actual bottom electrodes BE adjacent to each other. A rectangular shape elongated in a first direction D1 may be obtained in a plan view when connecting an inner sidewall of the first support holes 10a with central points of the actual bottom electrodes BE exposed through the first support hole 10a. Each of the first support holes 10a may have a first width W1 parallel to or in the first direction D1 and a second width W2 parallel to or in a second direction D2 intersecting the first direction D1. The first width W1 may be greater than the second width W2. Although not shown, one of the first support holes 10a that is disposed adjacent to the dummy cell region B may expose at least one dummy bottom electrode DBE.

The second support hole 10b may partially and simultaneously expose side surfaces of first to eighth bottom electrodes BE1 to BE8 adjacent to each other. At least one of the first to eighth bottom electrodes BE1 to BE8 may be the actual bottom electrode BE. At least another of the first to eighth bottom electrodes BE1 to BE8 may be the dummy bottom electrode DBE. The first to eighth bottom electrodes BE1 to BE8 may be disposed along a clockwise direction. The second support hole 10b may simultaneously expose the side surface of at least one actual bottom surface BE and the side surface of at least one dummy bottom electrode DBE. For example, the second support hole 10b may simultaneously expose the side surfaces of six or seven actual bottom surfaces BE and the side surfaces of one or two dummy bottom electrodes DBE. When viewed in plan, a ribbon-like (or butterfly-like) hexagon may be obtained when connecting an inner sidewall of the second support hole 10b with central points of the first to eighth bottom electrodes BE1 to BE8 exposed through the second support hole 10b. The first to third bottom electrodes BE1 to BE3 may be spaced apart from each other in the first direction D1 on a first row. The eighth and fourth bottom electrodes BE8 and BE4 may be spaced apart from each other in the first direction D1 on a second row. The seventh, sixth, and fifth bottom electrodes BE7, BE6, and BE5 may be spaced apart from each other in the first direction D1 on a third row. The first to third rows may be spaced apart from each other in the second direction D2. A length of a first line segment S1 that connects central points of the first to third bottom electrodes BE1 to BE3 exposed through the second support hole 10b may be the same as a length of a second line segment S2 that connects central points of the fifth to seventh bottom electrodes BE5 to BE7 exposed to the second support hole 10b. A distance between the central point of the fourth bottom electrode BE4 and the central point of the eighth bottom electrode BE8 may be less than the length of the first line segment S1. The second support hole 10b may have a third width W3 parallel to or in the first direction D1 and a fourth width W4 parallel to or in the second direction D2. The third width W3 may be less than the first width W1, and the fourth width W4 may be greater than the second width W2. Although not shown, a shape of the second support hole 10b may rotate at a certain angle relative to the first direction D1. The second support hole 10b may have an opening area the same as or greater than that of the first support hole 10a.

The side surfaces of all of the actual bottom electrodes BE may not be exposed through the first support holes 10a or the second support holes 10b. The side surfaces of some of the actual bottom electrodes BE may be exposed neither through the first support holes 10a nor through the second support holes 10b. All of the bottom electrodes BE and DBE may be partially in contact with the support pattern 112, and may thus be supported by the support pattern 112 when removing the first mold layer 110 of FIG. 16. Other structural features may be identical or similar to those discussed above.

As semiconductor devices become highly integrated, gaps between the bottom electrodes BE and DBE may become smaller, with the result that it may be difficult to expose the side surfaces of all of the actual bottom electrodes BE. As shown in FIG. 18C, the second support hole 10b may be formed to have a different shape from that of the first support hole 10a, and in this case, a total opening area of the first and second support holes 10a and 10b may increase compared to a case where only the first support holes 10a are present. Accordingly, the removal of the first mold layer 110 of FIG. 16 may be easily performed.

Figure 19:
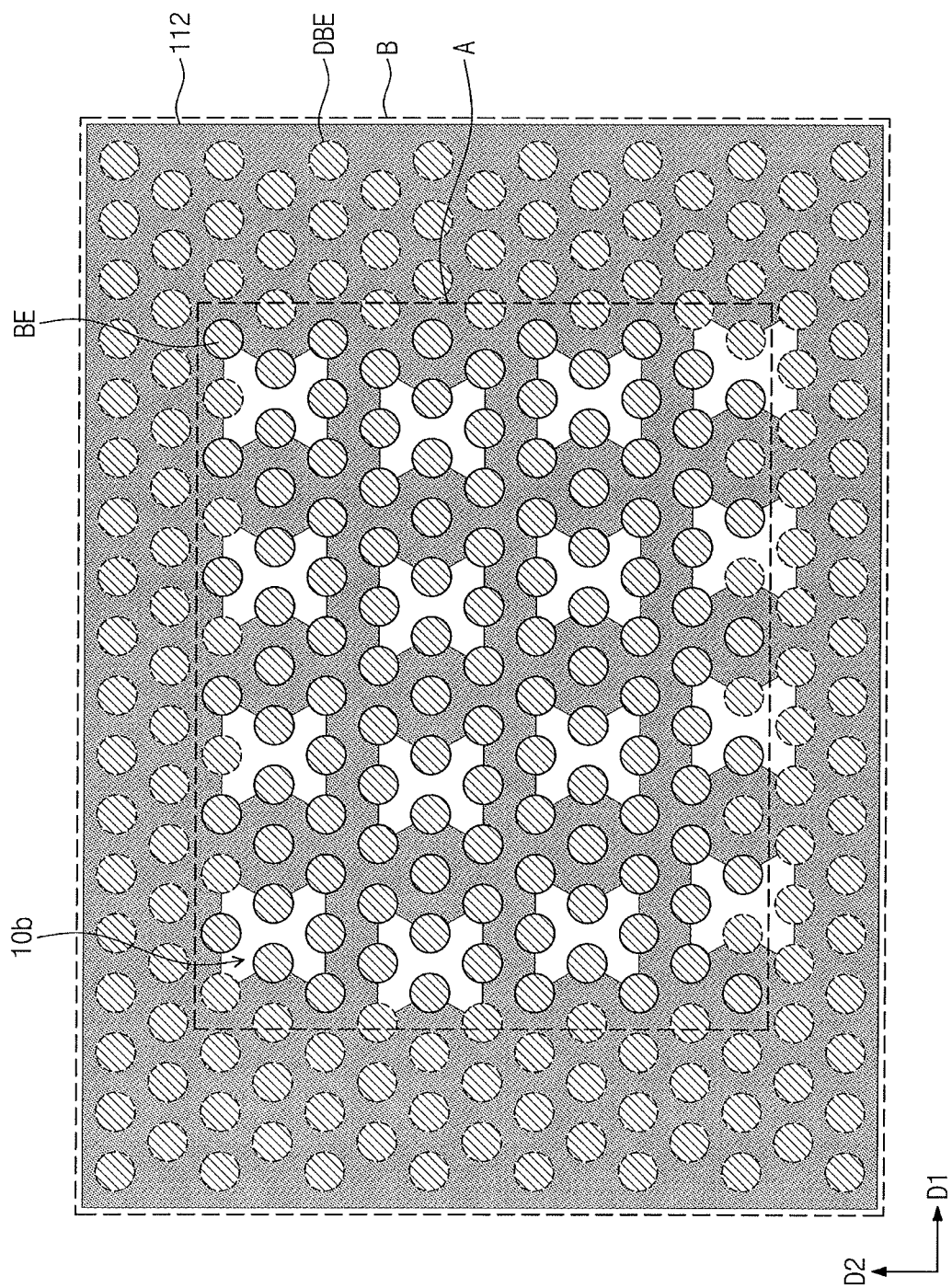
FIG. 19 illustrates a plan view of a semiconductor device according to exemplary embodiments.

FIG. 19 illustrates a plan view of a semiconductor device according to exemplary embodiments.

Referring to FIG. 19, a semiconductor device according to the present embodiment may be configured such that the support pattern 112 may include only the second support holes 10b. Even when the second support holes 10b are disposed adjacent not only to the edge portion of the actual cell region A but also to the central portion of the actual cell region A, the second support holes 10b may be disposed at a regular interval. Some of the second support holes 10b may extend into the dummy cell region B. The second support holes 10b may have a ribbon-like hexagonal structure when viewed in plan, and each of the second support holes 10b may partially and simultaneously expose the side surfaces of eight bottom electrodes BE and DBE adjacent to each other. Other structural features may be identical or similar to those discussed above. As semiconductor devices become highly integrated, not only gaps between the bottom electrodes BE and DBE become smaller, but also sizes of support holes become reduced, which makes it difficult to form the support holes. In contrast, the shapes of the second support holes 10b may approach a square, and thus it may be advantageous to simultaneously expose a large number of the bottom electrodes BE and DBE and also to prevent collapse of the bottom electrodes BE and DBE, which may result in an increase in opening area.

Figure 20A:
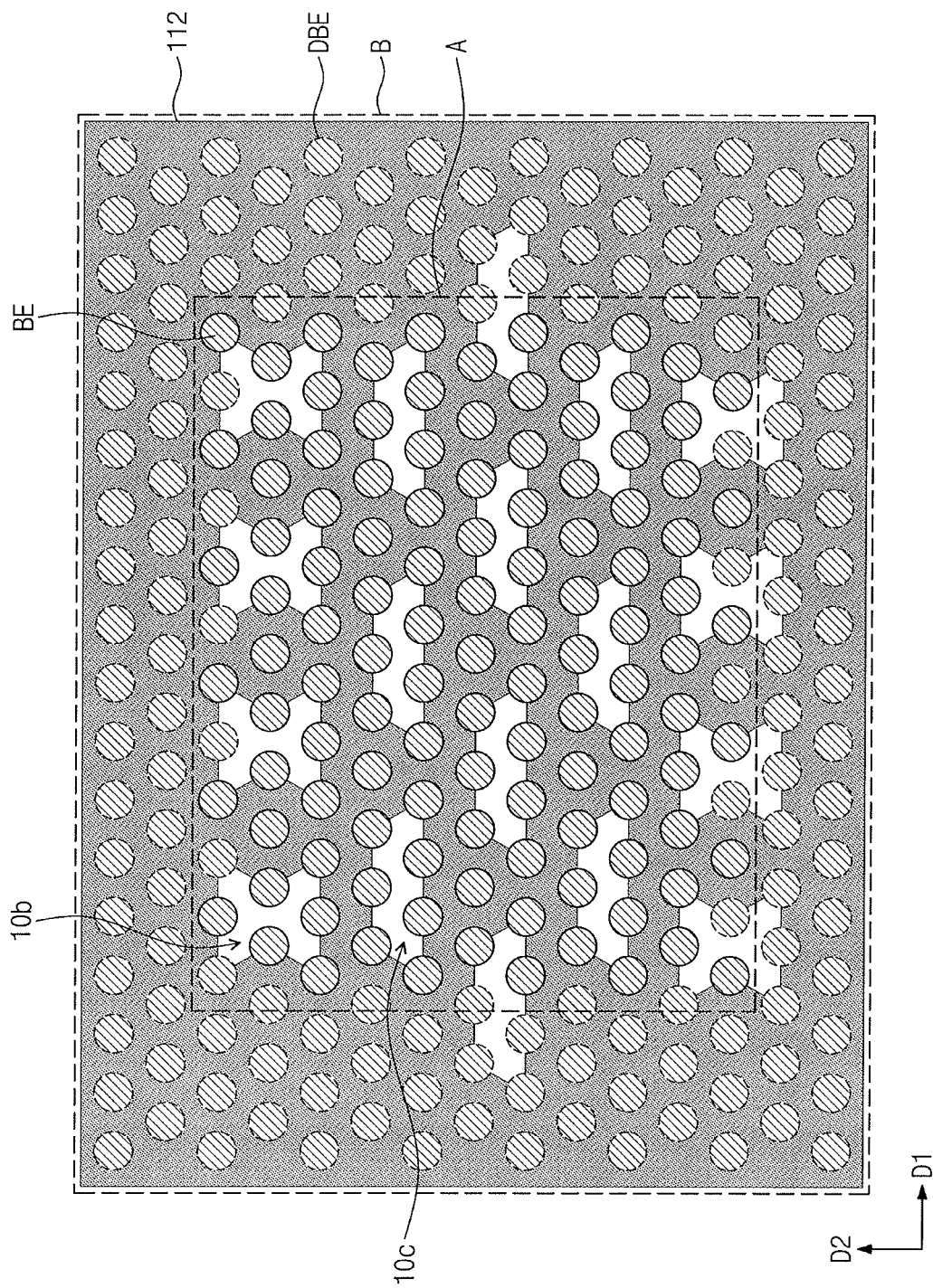
FIG. 20A illustrates a plan view of a semiconductor device according to exemplary embodiments.
Figure 20B:
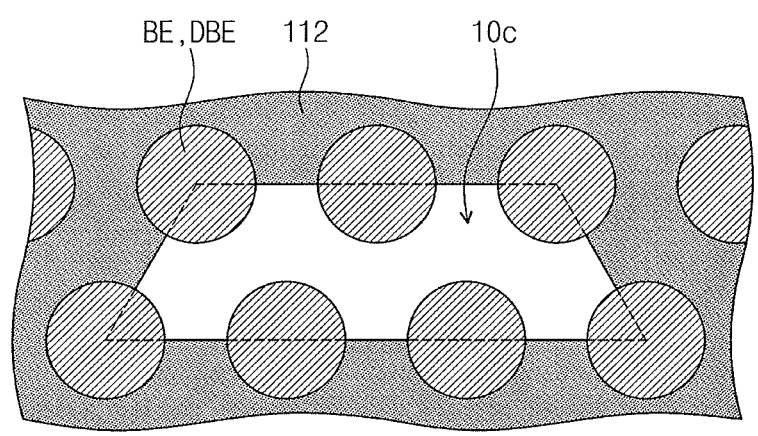
FIG. 20B illustrates an enlarged view of a first support hole of FIG. 20A.

FIG. 20A illustrates a plan view of a semiconductor device according to exemplary embodiments. FIG. 20B illustrates an enlarged view of a first support hole of FIG. 20A.

Referring to FIGS. 20A and 20B, a semiconductor device according to the present embodiment may be configured such that the support pattern 112 may include second support holes 10b and third support holes 10c. The second support holes 10b may be identical or similar to those discussed above with reference to FIGS. 18A, 18C, and 19. The third support holes 10c may be positioned close to the central portion of the actual cell region A. Some of the third support holes 10c may extend into the dummy cell region B. The third support holes 10c adjacent to the central portion of the actual cell region A may expose the actual bottom electrodes BE. The third support holes 10c adjacent to the dummy cell region B may expose the side surface of at least one actual bottom electrode BE and the side surface of at least one dummy bottom electrode DBE. Each of the third support holes 10c may partially and simultaneously expose the side surfaces of seven bottom electrodes BE and DBE adjacent to each other.

A trapezoidal shape elongated in the first direction D1 may be obtained in a plan view when connecting an inner sidewall of the third support hole 10c with central points of the bottom electrodes BE and DBE exposed through the third support hole 10c. Other structural features may be identical or similar to those discussed above.

Figure 21A:
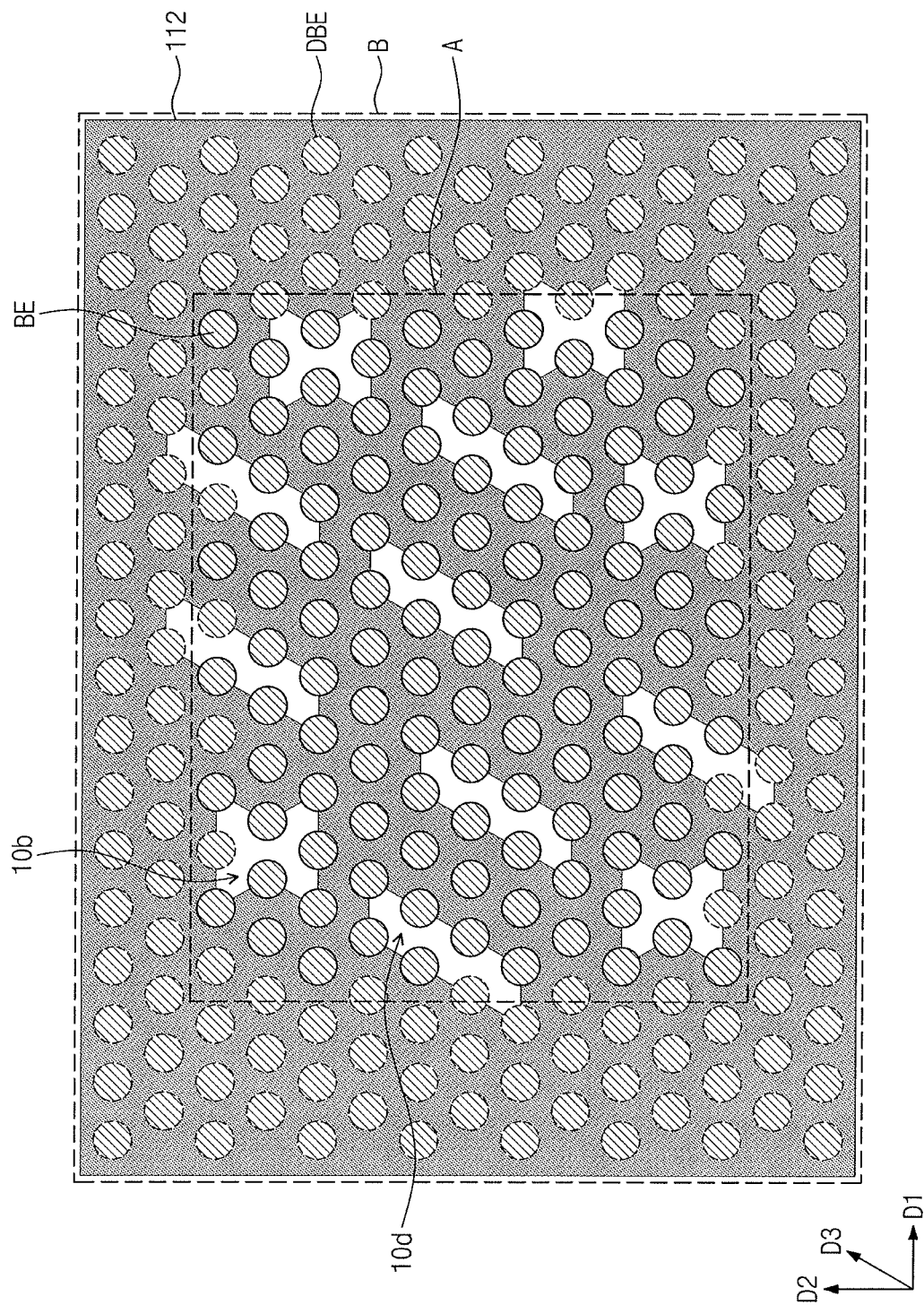
FIG. 21A illustrates a plan view of a semiconductor device according to exemplary embodiments.
Figure 21B:
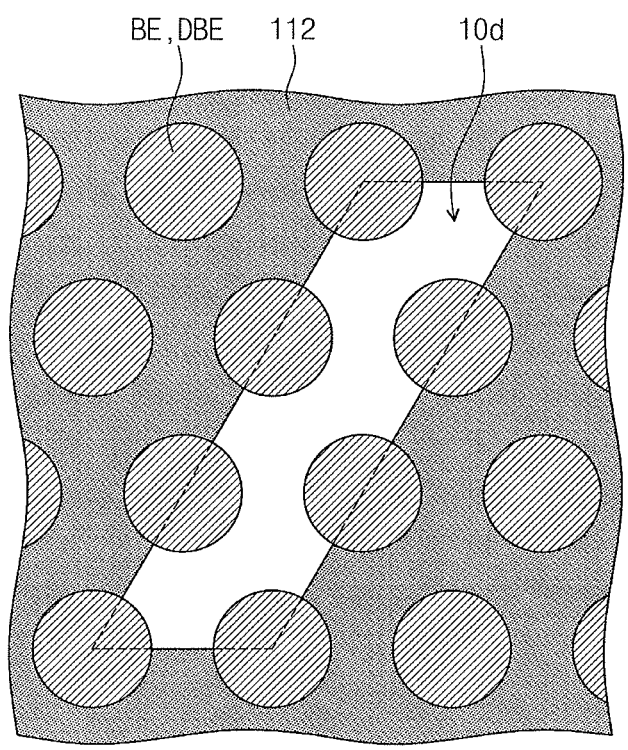
FIG. 21B illustrates an enlarged view of a first support hole of FIG. 21A.

FIG. 21A illustrates a plan view of a semiconductor device according to exemplary embodiments. FIG. 21B illustrates an enlarged view of a first support hole of FIG. 21A.

Referring to FIGS. 21A and 21B, a semiconductor device according to the present embodiment may be configured such that the support pattern 112 may include second support holes 10b and fourth support holes 10d. The second support holes 10b may be identical or similar to those discussed above with reference to FIGS. 18A, 18C, and 19. The fourth support holes 10d may be positioned close to the central portion of the actual cell region A. Some of the fourth support holes 10d may extend into the dummy cell region B. The fourth support holes 10d adjacent to the central portion of the actual cell region A may expose the actual bottom electrodes BE. The fourth support holes 10d adjacent to the dummy cell region B may expose the side surface of at least one actual bottom electrode BE and the side surface of at least one dummy bottom electrode DBE. Each of the fourth support holes 10d may partially and simultaneously expose the side surfaces of eight bottom electrodes BE and DBE adjacent to each other.

A parallelogram shape elongated in a third direction D3 may be obtained in a plan view when connecting an inner sidewall of the fourth support hole 10d with central points of the bottom electrodes BE and DBE exposed through the fourth support hole 10d. The third direction D3 may intersect the first and second directions D1 and D2. Other structural features may be identical or similar to those discussed above.

Figure 22:
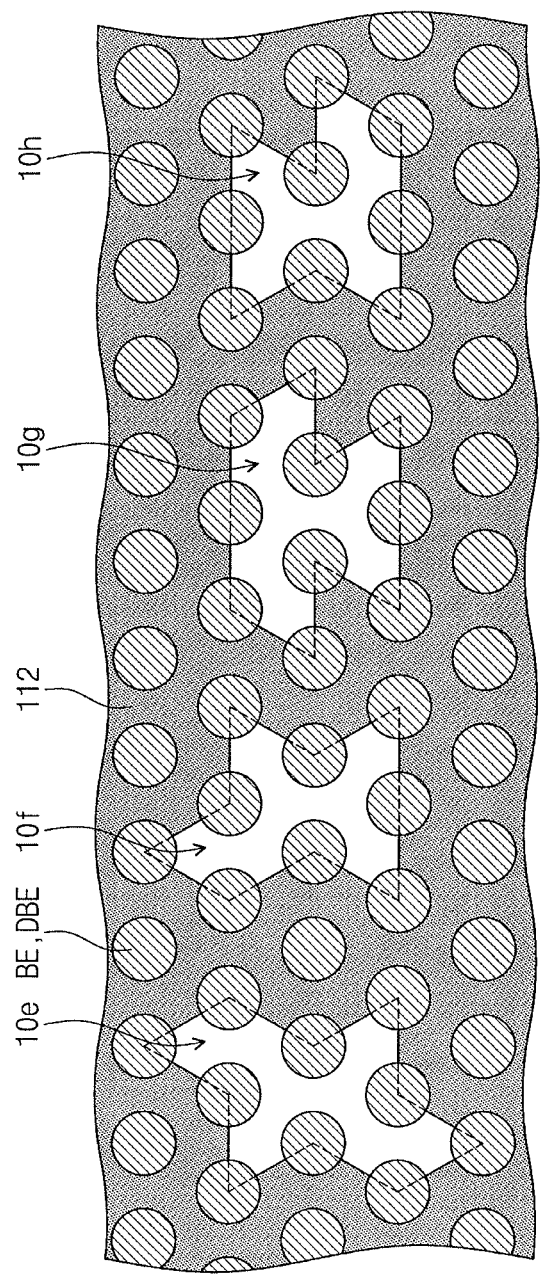
FIG. 22 illustrates a plan view of a semiconductor device according to exemplary embodiments.

FIG. 22 illustrates a plan view of a semiconductor device according to exemplary embodiments.

Referring to FIG. 22, the support pattern 112 according to the present embodiment may include fifth to eight support holes 10e to 10h that are variously shaped. The fifth support hole 10e may partially and simultaneously expose the side surfaces of ten bottom electrodes BE and DBE. A decagonal shape may be obtained when connecting an inner sidewall of the firth support hole 10e with central points of the bottom electrodes BE and DBE exposed through the fifth support hole 10e. The sixth support hole 10f may partially and simultaneously expose the side surfaces of nine bottom electrodes BE and DBE. An octagonal shape may be obtained when connecting an inner sidewall of the sixth support hole 10f with central points of the bottom electrodes BE and DBE exposed through the sixth support hole 10f The seventh support hole 10g may partially and simultaneously expose the side surfaces of ten bottom electrodes BE and DBE. An octagonal shape may be obtained when connecting an inner sidewall of the seventh support hole 10g with central points of the bottom electrodes BE and DBE exposed through the seventh support hole 10g. The eighth support hole 10h may partially and simultaneously expose the side surfaces of nine bottom electrodes BE and DBE. A heptagonal shape may be obtained when connecting an inner sidewall of the eighth support hole 10h with central points of the bottom electrodes BE and DBE exposed through the eighth support hole 10h.

The support pattern 112 may be provided therein with at least one of the fifth to eighth support holes 10e to 10h and with at least one of the first to fourth support holes 10a to 10d of FIGS. 18A, 19, 20A, and 21A. At least one of the fifth to eighth support holes 10e to 10h may be disposed adjacent to the dummy cell region B. At least one of the fifth to eighth support holes 10e to 10h may be provided in plural. At least one of the fifth to eighth support holes 10e to 10h may simultaneously expose at least one actual bottom electrode BE and at least one dummy bottom electrode DBE. Other structural features may be identical or similar to those discussed above. Each of the fifth to eighth support holes 10e to 10h may have a planar shape that provides an opening area greater than that of each of the first to fourth support holes 10a to 10d of FIGS. 18A, 19, 20A, and 21A.

Figure 23:
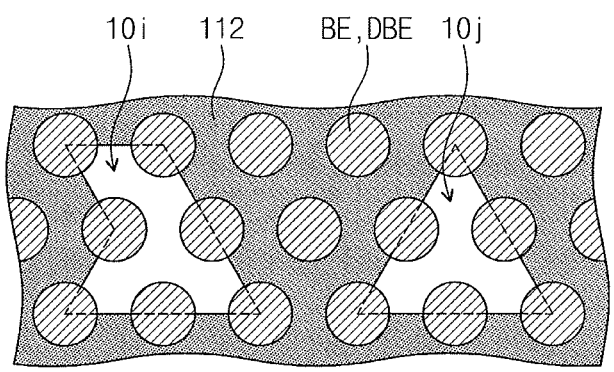
FIG. 23 illustrates a plan view of a semiconductor device according to exemplary embodiments.

FIG. 23 illustrates a plan view showing a semiconductor device according to exemplary embodiments of inventive concepts.

Referring to FIG. 23, the support pattern 112 according to the present embodiment may include a ninth support hole 10i and a tenth support hole 10j. Each of the ninth and tenth support holes 10i and 10j may have an opening area less than that of each of the first to fourth support holes 10a to 10d of FIGS. 18A, 19, 20A, and 21A. The ninth support hole 10i may partially and simultaneously expose the side surfaces of seven bottom electrodes BE and DBE. A pentagonal shape may be obtained when connecting an inner sidewall of the ninth support hole 10i with central points of the bottom electrodes BE and DBE exposed through the ninth support hole 10i. The tenth support hole 10j may partially and simultaneously expose the side surfaces of six bottom electrodes BE and DBE. A triangular shape may be obtained when connecting an inner sidewall of the tenth support hole 10j with central points of the bottom electrodes BE and DBE exposed through the tenth support hole 10j. At least one of the first to tenth support holes 10a to 10j may be provided in plural in the support pattern 112. A variation in shape of the support holes 10a to 10j may lead to an increase in total opening area, thereby fabricating a semiconductor device with enhanced reliability.

Figure 24:
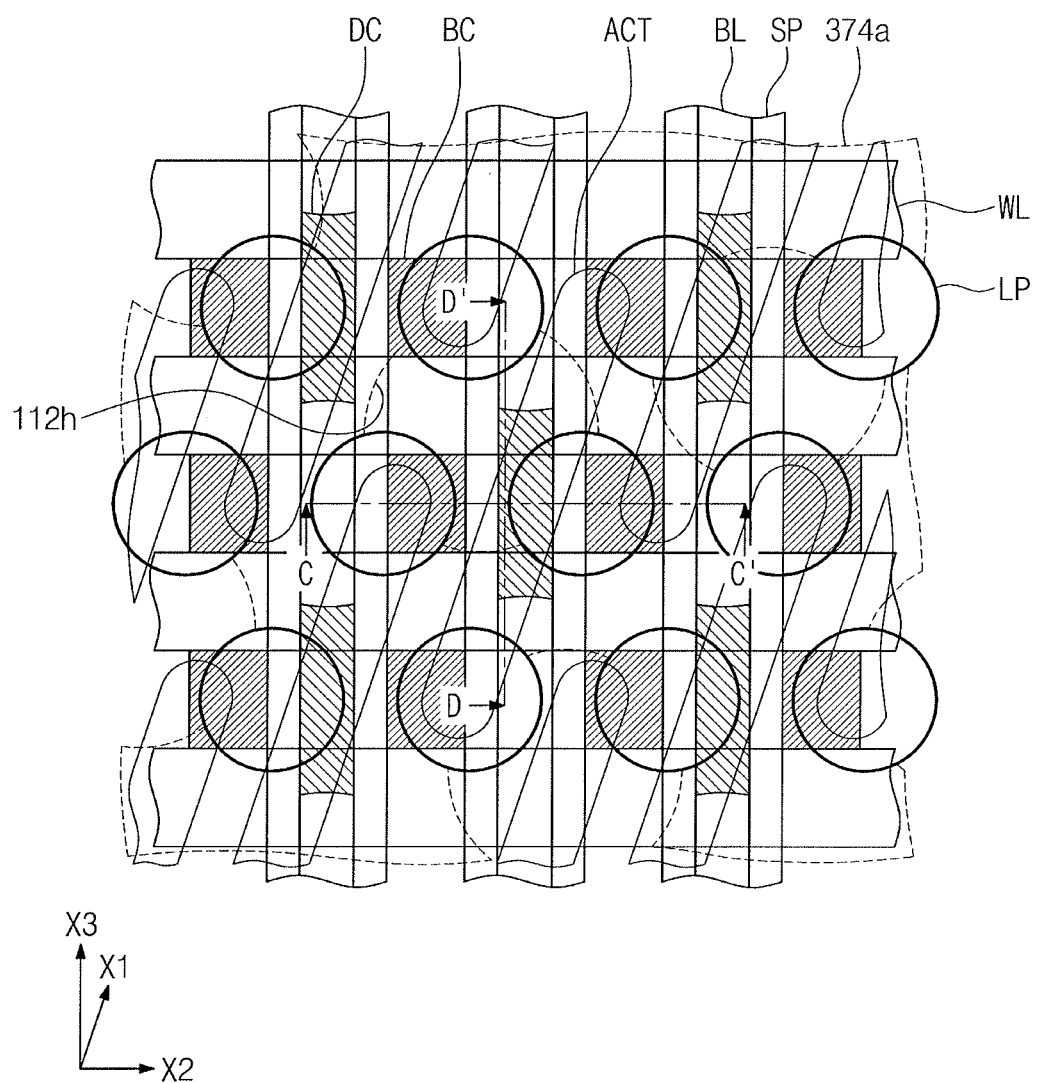
FIG. 24 illustrates a plan view of a semiconductor device according to exemplary embodiments.
Figure 25:
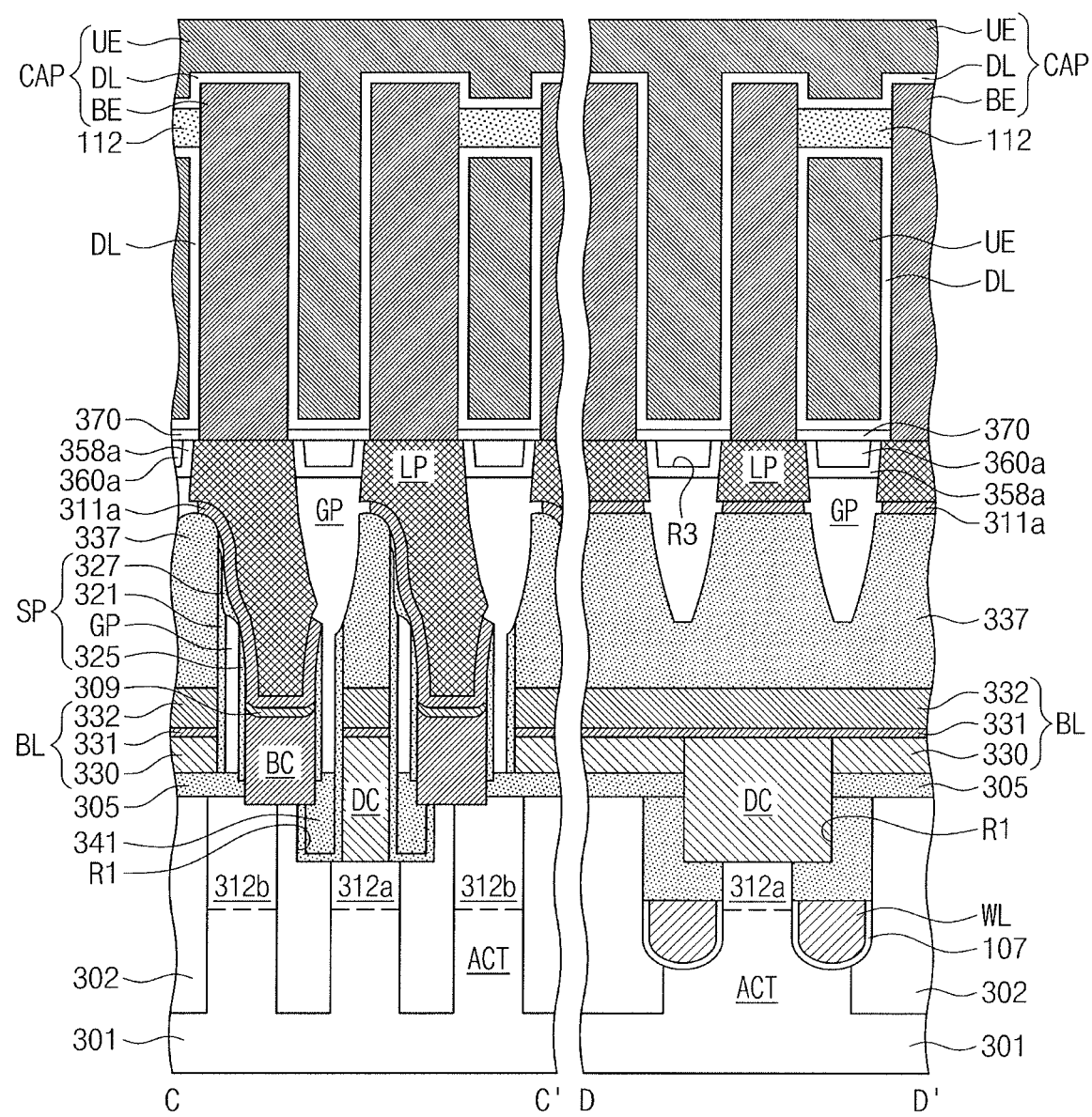
FIG. 25 illustrates a cross-sectional view taken along lines C-C' and D-D' of FIG. 24.

FIG. 24 illustrates a plan view of a semiconductor device according to exemplary embodiments. FIG. 25 illustrates a cross-sectional view taken along lines C-C' and D-D' of FIG. 24.

Referring to FIGS. 24 and 25, device isolation patterns 302 may be disposed in a substrate 301, defining active sections ACT. The substrate 301 may include the actual cell region A and the dummy cell region B of FIGS. 1 to 21A. Each of the active sections ACT may have an isolated shape. Each of the active sections ACT may have a bar shape elongated along a first direction X1 when viewed in plan. When viewed in plan, the active sections ACT may correspond to portions of the substrate 301 that are surrounded by the device isolation patterns 302. The substrate 301 may include a semiconductor material. The active sections ACT may be arranged parallel to each other in the first direction X1, such that one of the active sections ACT may have an end portion adjacent to a central portion of a neighboring one of the active sections ACT.

Word lines WL may run across the active sections ACT. The word lines WL may be disposed in grooves formed in the device isolation patterns 302 and the active sections ACT. The word lines WL may be parallel to a second direction X2 intersecting the first direction X1. The word lines WL may be formed of a conductive material. A gate dielectric layer 307 may be disposed between each of the word lines WL and an inner surface of each groove. Although not shown, each of the grooves may have a bottom surface located relatively deeper in the device isolation patterns 302 and relatively shallower in the active sections ACT. The gate dielectric layer 307 may include one or more of thermal oxide, silicon nitride, silicon oxynitride, and high-k dielectric. Each of the word lines WL may have a curved bottom surface.

A first doped region 312a may be disposed in the active section ACT between a pair of word lines WL, and a pair of second doped regions 312b may be disposed in opposite edge portions of each active section ACT. The first and second doped regions 312a and 312b may be doped with, for example, N-type impurities. The first doped region 312a may correspond to a common drain region, and the second doped regions 312b may correspond to source regions. A transistor may be constituted by each of the word lines WL and its adjacent first and second doped regions 312a and 312b. Because the word lines WL are disposed in the grooves, each of the word lines WL may have thereunder a channel region whose length becomes increased within a limited planar area. Accordingly, short-channel effects and the like may be minimized.

The word lines WL may have their top surfaces lower than those of the active sections ACT. A word-line capping pattern 310 may be disposed on each of the word lines WL. The word-line capping patterns 310 may have linear shapes extending along longitudinal directions of the word lines WL, and may cover entire top surfaces of the word lines WL. The grooves may have inner spaces not occupied by the word lines WL, and the word-line capping patterns 310 may fill the unoccupied inner spaces of the grooves. The word-line capping patterns 310 may be formed of, for example, a silicon nitride layer.

An interlayer dielectric pattern 305 may be disposed on the substrate 301. The interlayer dielectric pattern 305 may be formed of a single or multiple layer including one or more of a silicon oxide layer, a silicon nitride layer, and a silicon oxynitride layer. The interlayer dielectric pattern 305 may be formed to have island shapes spaced apart from each other when viewed in plan. The interlayer dielectric pattern 305 may be formed to simultaneously cover end portions of two neighboring active sections ACT.

Top portions of the substrate 301, the device isolation pattern 302, and the word-line capping pattern 310 may be partially recessed to form a first recess region R1. The first recess region R1 may have a net or mesh shape when viewed in plan. The first recess region R1 may have a sidewall aligned with that of the interlayer dielectric pattern 305.

Bit lines BL may be disposed on the interlayer dielectric pattern 305. The bit lines BL may run across the word-line capping patterns 310 and the word lines WL. As shown in FIG. 24, the bit lines BL may be parallel to a third direction X3 intersecting the first and second directions X1 and X2. Each of the bit lines BL may include a bit-line polysilicon pattern 330, a bit-line ohmic pattern 331, and a bit-line metal-containing pattern 332 that are sequentially stacked. The bit-line polysilicon pattern 330 may include impurity-doped polysilicon or impurity-undoped polysilicon. The bit-line ohmic pattern 331 may include a metal silicide layer. The bit-line metal-containing pattern 332 may include one or more of metal (e.g., tungsten, titanium, and tantalum) and conductive metal nitride (e.g., titanium nitride, tantalum nitride, and tungsten nitride). A bit-line capping pattern 337 may be disposed on each of the bit lines BL. The bit-line capping patterns 337 may be formed of a dielectric material, such as a silicon nitride layer.

Bit-line contacts DC may be disposed in the first recess region R1 intersecting the bit lines BL. The bit-line contacts DC may include impurity-doped polysilicon or impurity-undoped polysilicon. When viewed in cross-section taken along line B-B' as shown in FIG. 25, the bit-line contact DC may have a sidewall in contact with that of the interlayer dielectric pattern 305. When viewed in plan as shown in FIG. 24, the bit-line contact DC may have a concave side surface in contact with the interlayer dielectric pattern 305. The bit-line contact DC may electrically connect the first doped region 312a to the bit line BL.

The first recess region R1 may have an empty space not occupied by the bit-line contact DC, and a lower buried dielectric pattern 341 may occupy the empty space of the first recess region R1. The lower buried dielectric pattern 341 may be formed of a single or multiple layer including one or more of a silicon oxide layer, a silicon nitride layer, and a silicon oxynitride layer.

Storage node contacts BC may be disposed between a pair of neighboring bit lines BL. The storage node contacts BC may be spaced apart from each other. The storage node contacts BC may include impurity-doped polysilicon or impurity-undoped polysilicon. The storage node contacts BC may have their concave top surfaces. Between the bit lines BL, a dielectric pattern (not shown) may be disposed between the storage node contacts BC.

A bit-line spacer SP may be interposed between the bit line BL and the storage node contact BC. The bit-line spacer SP may include a first sub-spacer 321 and a second sub-spacer 325 that are spaced apart from each other across a gap region GP. The gap region GP may be called an air gap. The first sub-spacer 321 may cover a sidewall of the bit line BL and a sidewall of the bit-line capping pattern 337. The second sub-spacer 325 may be adjacent to the storage node contact BC. The first sub-spacer 321 and the second sub-spacer 325 may include the same material. For example, the first sub-spacer 321 and the second sub-spacer 325 may include a silicon nitride layer.

The second sub-spacer 325 may have a bottom surface lower than that of the first sub-spacer 321. The second sub-spacer 325 may have a top end whose height is less than that of a top end of the first sub-spacer 321. Such a configuration may increase a formation margin for landing pads LP which will be discussed below. As a result, the landing pad LP and the storage node contact BC may be prevented from being disconnected to each other. The first sub-spacer 321 may extend to cover a sidewall of the bit-line contact DC and also to cover a sidewall and a bottom surface of the first recess region R1. For example, the first sub-spacer 321 may be interposed between the bit-line contact DC and the lower buried dielectric pattern 341, between the word-line capping pattern 310 and the lower buried dielectric pattern 341, between the substrate 301 and the lower buried dielectric pattern 341, and between the device isolation pattern 302 and the lower buried dielectric pattern 341.

A storage node ohmic layer 309 may be disposed on the storage node contact BC. The storage node ohmic layer 309 may include metal silicide. The storage node ohmic layer 309, the first and second sub-spacers 321 and 325, and the bit-line capping pattern 337 may be conformally covered with a diffusion stop pattern 311a. The diffusion stop pattern 311a may include metal nitride, such as a titanium nitride layer or a tantalum nitride layer. A landing pad LP may be disposed on the diffusion stop pattern 311a. The landing pad LP may be formed of a material containing metal such as tungsten. The landing pad LP may have an upper portion that covers a top surface of the bit-line capping pattern 337 and has a width greater than that of the storage node contact BC. A center of the landing pad LP may shift in the second direction X2 away from a center of the storage node contact BC. A portion of the bit line BL may vertically overlap the landing pad LP. An upper sidewall of the bit-line capping pattern 337 may overlap the landing pad LP and may be covered with a third sub-spacer 327. A second recess region R2 may be formed on other upper sidewall of the bit-line capping pattern 337.

A first capping pattern 358a may cover and connect upper sidewalls of neighboring landing pads LP. The first capping pattern 358a may have a uniform thickness regardless of position. The first capping pattern 358a may have a third recess region R3 between the landing pads LP. The third recess region R3 may be filled with a second capping pattern 360a. The first and second capping patterns 358a and 360a may independently include a silicon nitride layer, a silicon oxide layer, a silicon oxynitride layer, or a porous layer. The first capping pattern 358a may have porosity greater than that of the second capping pattern 360a. The first and second capping patterns 358a and 360a may have their top surfaces coplanar with those of the landing pads LP.

The gap region GP between the first and second sub-spacers 321 and 325 may extend into a space between the landing pads LP. The gap region GP may expose a bottom surface of the first capping pattern 358a. The gap region GP may extend toward the diffusion stop pattern 311a. For example, the diffusion stop pattern 311a may have a sidewall that is recessed between the landing pad LP and the bit line capping pattern 337. The gap region GP may partially expose a top surface of the bit line capping pattern 337 and a bottom surface of the landing pad LP.

Bottom electrodes BE may be disposed on corresponding landing pads LP. The bottom electrode BE may include one or more of an impurity-doped polysilicon layer, a metal nitride layer such as a titanium nitride layer, and a metal layer such as a tungsten layer, an aluminum layer, and a copper layer. The bottom electrode BE may be an actual bottom electrode or a dummy bottom electrode. The bottom electrode BE may have a circular columnar shape, a hollow cylindrical shape, or a cup shape. A support pattern 112 may connect to each other upper sidewalls of neighboring bottom electrodes BE. The support pattern 112 may include a dielectric material, such as a silicon nitride layer, a silicon oxide layer, and a silicon oxynitride layer. The support pattern 112 may include a plurality of support holes 112h. A planar shape of each of the support holes 112h may be variously changed as discussed above with reference to FIGS. 1 to 23.

An etch stop layer 370 may cover top surfaces of the first and second capping patterns 358a and 360a between the bottom electrodes BE. The etch stop layer 370 may include a dielectric material, such as a silicon nitride layer, a silicon oxide layer, and a silicon oxynitride layer. A dielectric layer DL may cover surfaces of the bottom electrodes BE and a surface of the support pattern 112. The dielectric layer DL may include a metal oxide layer, such as an aluminum oxide layer. The dielectric layer DL may be covered with a top electrode UE. The top electrode UE may include one or more of an impurity-doped polysilicon layer, an impurity-doped silicon-germanium layer, a metal nitride layer such as a titanium nitride layer, and a metal layer such as a tungsten layer, an aluminum layer, and a copper layer. A capacitor CAP may be constituted by the bottom electrode BE, the dielectric layer DL, and the top electrode UE.

A semiconductor device according to some example embodiments of the present inventive concepts may be configured such that the gap region GP may extend into a space between the landing pads LP, without being interrupted by upper portions of the first and second sub-spacers 321 and 325, and thus the gap region GP may be sufficiently provided between the first and second sub-spacers 321 and 325. Because air (vapor or vacuum) has a lower dielectric constant than that of silicon oxide, the gap region GP may reduce a parasitic capacitance between the bit line BL and the storage node contact BC. In addition, the landing pads LP may have a reduced parasitic capacitance therebetween.

By way of summation and review, embodiments provide a highly integrated semiconductor device. That is, in a semiconductor device according to exemplary embodiments, the support pattern supporting the bottom electrodes may include support holes having different shapes from each other. As such, the support holes may expose side surfaces of all of actual bottom electrodes serving as a memory on an actual cell region without extending into a dummy cell region. In addition, as the support holes are formed all within the actual cell region, a width of the support pattern does not require extension toward a peripheral circuit area. Further, the support holes may be used to selectively remove mold layers without damage to the bottom electrodes. A dielectric layer and a top electrode layer may be formed to have a uniform thickness on the actual cell region. It may thus be achieved that a semiconductor device is fabricated to have high integration and reliability.

Furthermore, the semiconductor device according to some embodiments of the present inventive concepts may include support holes whose opening areas are different from each other, thereby increasing a total opening area. As a result, the semiconductor device may be fabricated to have improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a plurality of pillars on a semiconductor substrate; and
a support pattern in contact with at least one side surface of each of the pillars, the support pattern connecting the pillars with one another,
wherein the support pattern includes a plurality of support holes that expose side surfaces of the pillars,
wherein the support holes include a first support hole and a second support hole that are spaced apart from each other,
wherein the pillars have circular cross-sections, and
wherein a ribbon-like hexagon is obtained in a plan view when connecting an inner sidewall of the first support hole with central points of the cross-sections of the pillars exposed through the first support hole.

2. The semiconductor device as claimed in claim 1, wherein the first support hole partially and simultaneously exposes the side surfaces of eight pillars adjacent to each other.

3. The semiconductor device as claimed in claim 1, wherein the hexagon includes a first side and a second side that face each other, the first and second sides having the same length, and three pillars are on each of the first side and the second side.

4. The semiconductor device as claimed in claim 1, wherein the second support hole has a different shape from that of the first support hole.

5. The semiconductor device as claimed in claim 1, wherein, when viewed in plan, a tetragon is obtained when connecting an inner sidewall of the second support hole with central points of the cross-sections of the pillars exposed through the second support hole.

6. The semiconductor device as claimed in claim 1, wherein
the semiconductor substrate includes an actual cell region and a dummy cell region,
the pillars include a plurality of actual memory pillars on the actual cell region and a plurality of dummy memory pillars on the dummy cell region, the actual memory pillars performing a memory function, and the dummy memory pillars not performing a memory function, and
the first support hole simultaneously exposes a side surface of at least one actual memory pillar and a side surface of at least one dummy memory pillar.

7. The semiconductor device as claimed in claim 6, wherein the first support hole and the second support hole are only in the actual cell region.

8. The semiconductor device as claimed in claim 6, wherein the first support hole is adjacent to the dummy cell region.

9. The semiconductor device as claimed in claim 6, wherein
a plurality of the second support holes are on a central portion of the actual cell region,
at least one first support hole is at an edge portion of the actual cell region,
the second support holes have the same shape, and
the number of the second support holes is greater than that of the at least one first support hole.

10. The semiconductor device as claimed in claim 1, wherein a first width in a first direction of the first support hole is less than a second width in the first direction of the second support hole.

11. The semiconductor device as claimed in claim 10, wherein
the first support hole has a third width in a second direction intersecting the first direction, and
the second support hole has a fourth width in the second direction, the third width being greater than the fourth width.

12. A semiconductor device, comprising:
a plurality of pillars on a semiconductor substrate; and
a support pattern in contact with at least one side surface of each of the pillars, the support pattern connecting the pillars with one another,
wherein the support pattern includes a plurality of support holes that expose side surfaces of the pillars,
wherein the support holes include a plurality of first support holes and at least one second support hole that are spaced apart from each other, the at least one second support hole being peripheral with respect to the first support holes,
wherein the first support holes have a different shape from that of the at least one second support hole, and
wherein an opening area of the at least one second support hole is greater than that of each of the first support holes.

13. The semiconductor device as claimed in claim 12, wherein the at least one second support hole has a polygonal shape having six or more sides.

14. The semiconductor device as claimed in claim 12, wherein the at least one second support hole partially and simultaneously exposes side surfaces of eight to ten pillars.

15. The semiconductor device as claimed in claim 12, wherein, when viewed in plan, a tetragon is obtained when connecting an inner sidewall of the at least one second support hole with central points of cross-sections of the pillars exposed through the at least one second support hole.

16. The semiconductor device as claimed in claim 12, wherein:
the semiconductor substrate includes an actual cell region and a dummy cell region, the dummy cell region surrounding the actual cell region,
the pillars include a plurality of actual memory pillars only on the actual cell region and a plurality of dummy memory pillars only on the dummy cell region, the actual memory pillars performing a memory function, and the dummy memory pillars not performing a memory function, and
the at least one second support hole simultaneously exposes a side surface of at least one of the actual memory pillars and a side surface of at least one of the dummy memory pillars.

17. The semiconductor device as claimed in claim 16, wherein the first support holes are on a central portion of the actual cell region, and the at least one second support hole is only at an edge portion of the actual cell region among the central and edge portions of the actual cell region, the at least one second support hole being adjacent to the dummy cell region.

18. A semiconductor device, comprising:
a plurality of pillars on a semiconductor substrate; and a support pattern in contact with at least one side surface of each of the pillars, the support pattern connecting the pillars with one another, wherein the support pattern includes a plurality of support holes that expose side surfaces of the, wherein the support holes include a plurality of first support holes and at least one second support hole that are spaced apart from each other, the at least one second support hole being peripheral with respect to the first support holes, wherein the first support holes have a different shape from that of the at least one second support hole, and wherein an opening area of the at least one second support hole is different from that of each of the first support holes.

19. The semiconductor device as claimed in claim 18, wherein the number of the pillars exposed through each of the first support holes is different from that of the pillars exposed through the at least one second support hole.

20. The semiconductor device as claimed in claim 19, wherein:

the semiconductor substrate includes an actual cell region and a dummy cell region, the dummy cell region surrounding the actual cell region, the pillars include a plurality of actual memory pillars only on the actual cell region and a plurality of dummy memory pillars only on the dummy cell region, the actual memory pillars performing a memory function, and the dummy memory pillars not performing a memory function, and the at least one second support hole overlaps both the dummy cell region and the actual dell region, the at least one second support hole simultaneously exposing a side surface of at least one of the actual memory pillars and a side surface of at least one of the dummy memory pillars.

* * * * *